(12) United States Patent
Lee et al.

(10) Patent No.: US 12,324,342 B2
(45) Date of Patent: Jun. 3, 2025

(54) DISPLAY DEVICE ACQUIRING FINGERPRINT PATTERN AND TOUCH PRESSURE INFORMATION USING A SINGLE STRUCTURE

(71) Applicant: SAMSUNG DISPLAY CO., LTD., Yongin-si (KR)

(72) Inventors: Hee Kwon Lee, Asan-si (KR); Sung Un Park, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/051,501

(22) Filed: Oct. 31, 2022

(65) Prior Publication Data

US 2023/0083928 A1 Mar. 16, 2023

Related U.S. Application Data

(63) Continuation of application No. 16/138,308, filed on Sep. 21, 2018, now Pat. No. 11,487,380.

(30) Foreign Application Priority Data

Mar. 30, 2018 (KR) ........................ 10-2018-0037474

(51) Int. Cl.
*G06F 3/041* (2006.01)
*G06F 3/044* (2006.01)
(Continued)

(52) U.S. Cl.
CPC ........... *H10K 59/65* (2023.02); *G06F 3/0416* (2013.01); *G06F 3/044* (2013.01); *G06V 10/147* (2022.01);
(Continued)

(58) Field of Classification Search
CPC .... G06V 10/147; G06V 40/13; G06V 40/117; G06V 40/12; G06V 40/1318;
(Continued)

(56) References Cited

U.S. PATENT DOCUMENTS 8,736,001 B2 * 5/2014 Salatino ............. G06V 40/1329
257/415
10,572,043 B2 2/2020 Kim et al.
(Continued)

FOREIGN PATENT DOCUMENTS

KR 10-2017-0050536 5/2017
KR 10-1776667 9/2017
(Continued)

*Primary Examiner* — Ke Xiao
*Assistant Examiner* — Nelson Lam
(74) *Attorney, Agent, or Firm* — F. CHAU & ASSOCIATES, LLC

(57) ABSTRACT

A display device includes a display panel. A fingerprint sensor package at least partially overlaps the display panel. A printed circuit board (PCB) at least partially overlaps the display panel and includes a touch sensor integrated circuit (IC). The fingerprint sensor package includes a first base having a plurality of conductive patterns, an image sensor disposed on a first surface of the first base, and a first conductive layer disposed on a second surface of the first base, at least partially overlapping with the image sensor, and electrically connected to the plurality of conductive patterns of the first base via a via electrode.

26 Claims, 20 Drawing Sheets

(51) Int. Cl.
*G06V 10/147* (2022.01)
*G06V 40/13* (2022.01)
*H10K 59/12* (2023.01)
*H10K 59/40* (2023.01)
*H10K 59/65* (2023.01)
*H10K 77/10* (2023.01)
*H10F 39/12* (2025.01)
*H10K 102/00* (2023.01)

(52) U.S. Cl.
CPC ......... *G06V 40/1318* (2022.01); *H10K 59/12* (2023.02); *H10K 59/40* (2023.02); *H10K 77/111* (2023.02); *H10F 39/198* (2025.01); *H10K 2102/311* (2023.02)

(58) Field of Classification Search
CPC ........... G06V 40/1329; G06V 40/1365; G06V 40/1371; G06V 40/1376; G06F 3/041; G06F 3/0412; G06F 3/0414; G06F 3/0416; G06F 3/044; G06F 3/045; G06F 3/046; G06F 3/047
USPC .................................................. 345/173–179
See application file for complete search history.

(56) References Cited

U.S. PATENT DOCUMENTS

| | | | |
|---|---|---|---|
| 10,772,208 B2 | 9/2020 | Lee | |
| 10,782,817 B2 | 9/2020 | Kang et al. | |
| 10,809,861 B2 | 10/2020 | Kim et al. | |
| 10,839,193 B1 * | 11/2020 | Chen | G06V 40/1318 |
| 10,883,889 B2 * | 1/2021 | Lee | H10K 77/111 |
| 2008/0054875 A1 * | 3/2008 | Saito | G06V 40/1306 |
| | | | 324/71.5 |
| 2008/0187191 A1 | 8/2008 | Hwang et al. | |
| 2010/0026656 A1 * | 2/2010 | Hotelling | G06F 3/0446 |
| | | | 345/174 |
| 2010/0039121 A1 | 2/2010 | Iliev et al. | |
| 2011/0102569 A1 | 5/2011 | Erhart | |
| 2011/0248961 A1 * | 10/2011 | Svajda | G01S 17/46 |
| | | | 250/221 |
| 2014/0103943 A1 * | 4/2014 | Dunlap | H01L 21/486 |
| | | | 324/663 |
| 2014/0176485 A1 | 6/2014 | Holmberg et al. | |
| 2015/0036065 A1 | 2/2015 | Yousefpor et al. | |
| 2015/0146944 A1 | 6/2015 | Pi et al. | |
| 2018/0005004 A1 | 1/2018 | Du et al. | |
| 2018/0151641 A1 * | 5/2018 | Choo | G06F 1/1684 |
| 2018/0173343 A1 | 6/2018 | Pi et al. | |
| 2018/0213646 A1 | 7/2018 | Benkly, III et al. | |
| 2018/0217854 A1 | 8/2018 | Lee et al. | |
| 2018/0341290 A1 | 11/2018 | Sim et al. | |
| 2019/0095685 A1 * | 3/2019 | Yu | G06F 1/16 |
| 2019/0205595 A1 | 7/2019 | Gong et al. | |
| 2019/0260112 A1 | 8/2019 | Azad et al. | |
| 2019/0302953 A1 | 10/2019 | Lee et al. | |
| 2019/0308986 A1 | 10/2019 | Lee | |
| 2020/0019746 A1 * | 1/2020 | Fan | G06V 10/147 |
| 2020/0125815 A1 | 4/2020 | Lu et al. | |
| 2020/0302142 A1 * | 9/2020 | Liu | G06F 3/0412 |
| 2020/0380240 A1 | 12/2020 | Liu et al. | |
| 2021/0027039 A1 * | 1/2021 | Yi | G06V 10/147 |
| 2021/0240302 A1 | 8/2021 | Kim et al. | |
| 2022/0164564 A1 * | 5/2022 | Wu | G06V 40/1318 |
| 2023/0005894 A1 * | 1/2023 | Chang | H05K 1/181 |

FOREIGN PATENT DOCUMENTS

| | | |
|---|---|---|
| KR | 10-2017-0122386 | 11/2017 |
| KR | 10-2018-0001677 | 1/2018 |
| KR | 10-2018-0005833 | 1/2018 |
| KR | 10-2018-0017507 | 2/2018 |

* cited by examiner

311: 311a, 311b, 311c, 311d

DISPLAY DEVICE ACQUIRING FINGERPRINT PATTERN AND TOUCH PRESSURE INFORMATION USING A SINGLE STRUCTURE

CROSS REFERENCE TO RELATED APPLICATIONS

This application is a Continuation of co-pending U.S. patent application Ser. No. 16/138,308, filed on Sep. 21, 2018, which claims priority under 35 U.S.C. § 119 to Korean Patent Application No. 10-2018-0037474, filed on Mar. 30, 2018, the disclosures of which are herein incorporated by reference in their entirety.

TECHNICAL FIELD

The present disclosure relates to a chip package and, more particularly, to a fingerprint sensor package and a display device including the same.

DISCUSSION OF THE RELATED ART

Display devices are widely used in technological products. A typical display device such as a liquid crystal display (LCD) device, an organic light-emitting diode (OLED) display device, or the like includes a display panel on which pixels are defined. The pixels act together to display an image.

Modern display devices may incorporate various sensing functions in addition to an image display function. For example, a display device may further include a touch sensor capable of sensing touch information of a user, a fingerprint sensor capable of recognizing a fingerprint of the user, and/or an iris sensor capable of recognizing an iris of the user.

The display device including the touch sensor, the fingerprint sensor and/or the iris sensor can be applied to a portable electronic device such as a smartphone, a smartwatch, a tablet computer, a personal computer (PC), a notebook/laptop computer, and/or an electronic device such as a television (TV), a monitor, or a digital information display.

Display devices may either utilize separate areas for display and sensing or may provide a combined area for performing both image display and sensing. For example, a display device may have within a display area, a pressure sensing area in which touch pressure information of a user is acquired, and a fingerprint sensing area in which fingerprint pattern information of the user is acquired.

SUMMARY

A display device includes a display panel. A fingerprint sensor package at least partially overlaps the display panel. A printed circuit board (PCB) at least partially overlaps the display panel and includes a touch sensor integrated circuit (IC). The fingerprint sensor package includes a first base having a plurality of conductive patterns, an image sensor disposed on a first surface of the first base, and a first conductive layer disposed on a second surface of the first base, at least partially overlapping with the image sensor, and electrically connected to the plurality of conductive patterns of the first base via a via electrode.

A display device includes a display panel. A fingerprint sensor package at least partially overlaps the display panel and includes a first base, an image sensor disposed on a front surface of the first base, and a first conductive layer disposed on a rear surface of the first base. A PCB at least partially overlaps the display panel, and does not overlap the image sensor. The PCB includes a second base and a touch sensor IC disposed on a rear surface of the second base. A second conductive layer faces the first conductive layer. At least part of the front surface of the first base faces the rear surface of the second face.

A fingerprint sensor package includes a base having a plurality of conductive patterns disposed thereon. An image sensor is disposed on a first surface of the base. A conductive layer is disposed on a second surface of the base, at least partially overlapping the image sensor, and is electrically connected to the conductive patterns of the base. An area occupied by the conductive layer is larger than an area occupied by the image sensor.

BRIEF DESCRIPTION OF THE DRAWINGS

The above and other exemplary embodiments and features of the present disclosure will become more apparent by describing in detail exemplary embodiments thereof with reference to the attached drawings, in which.

DETAILED DESCRIPTION

Figure 1:
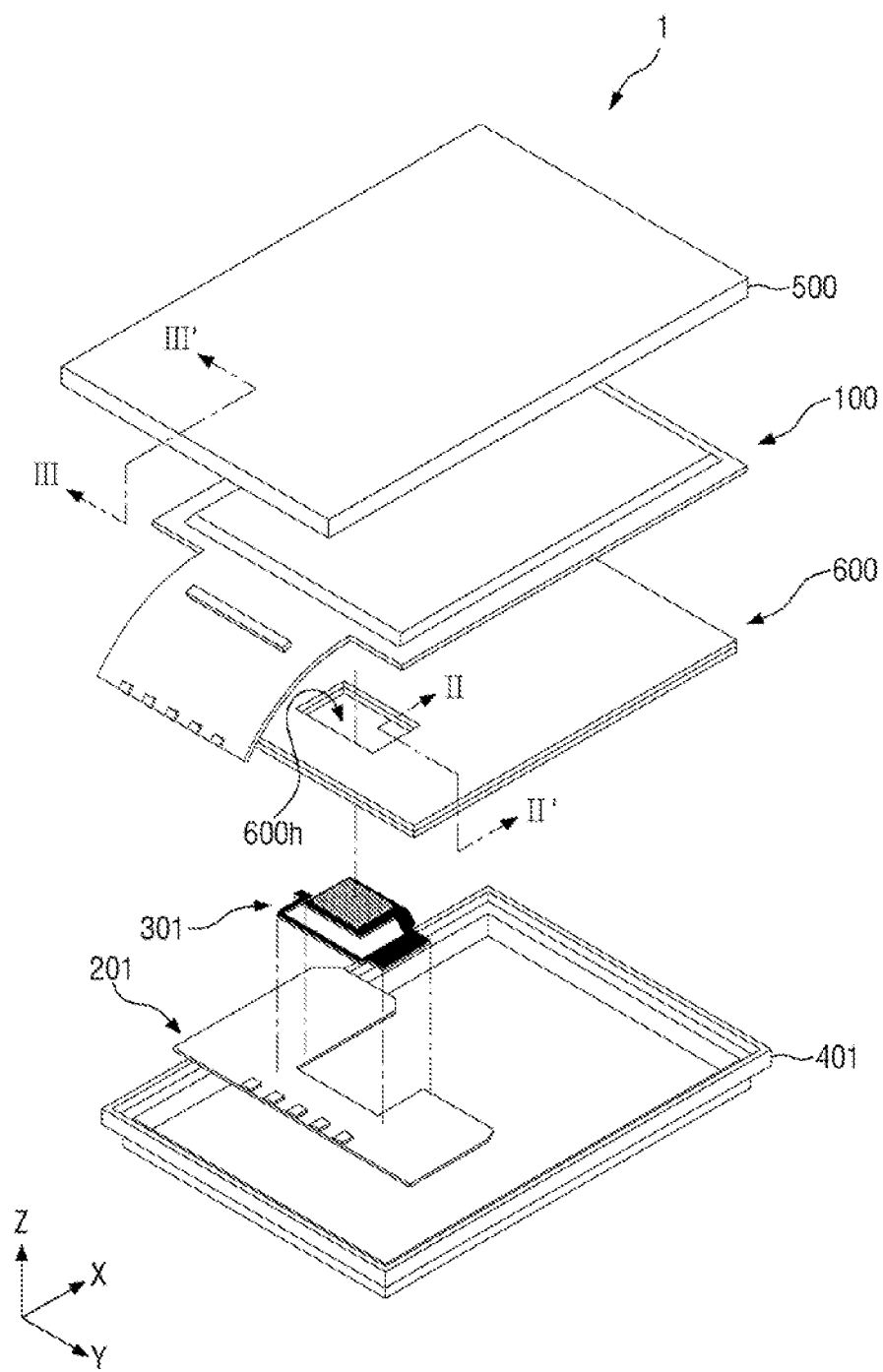
FIG. 1 is an exploded perspective view illustrating a display device according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Where an element is described herein as being related to another element such as being "on" another element or "located on" a different layer or a layer, includes both a case where an element is located directly on another element or a layer and a case where an element is located on another element via another layer or still another element. In the entire description and the drawings, the same drawing reference numerals may be used to represent the same or corresponding elements.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In the description that follows, a first direction X refers to an arbitrary direction on a particular plane, and a second direction Y refers to a direction intersecting the first direction X over the particular plane. Unless specified otherwise, the term "plane" refers to the plane that the first and second directions X and Y both belong to. A third direction Z refers to a direction perpendicular to the particular plane. Unless specified otherwise, the term "overlap" means that elements overlap with one another in the third direction Z in a plan view.

Exemplary embodiments of the present disclosure will hereinafter be described with reference to the accompanying drawings.

FIG. 1 is an exploded perspective view illustrating a display device 1 according to an exemplary embodiment of the present disclosure.

Referring to FIG. 1, the display device 1 may include a display panel 100, a printed circuit board (PCB) 201, and a fingerprint sensor package 301 and may further include a rear cover 401, a window 500, and a rear sheet member 600. The display device 1 may be utilized in various portable electronic devices or large-size electronic devices.

The display panel 100 may be a panel capable of realizing the display of an image. For example, the display panel 100 may include a plurality of pixels for realizing the display of an image. As used herein, the term "pixel" refers to a single and smallest elemental region for displaying an image. Each pixel may be configured to display a dot or box of a particular color at a variable level. Examples of the colors that may be displayed by each pixel includes red, green, and blue, but the present disclosure is not limited thereto and other colors may be represented such as white, cyan, magenta, yellow, etc.

Figure 2:
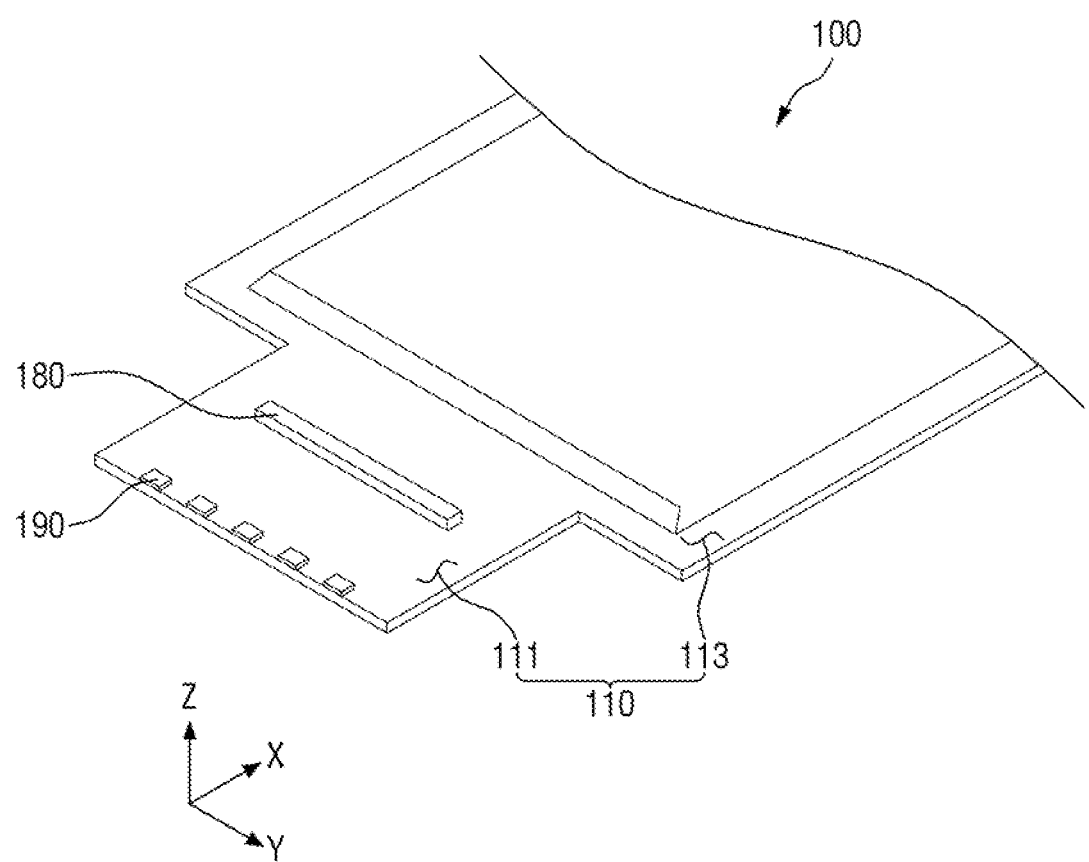
FIG. 2 is a perspective view illustrating a display panel of the display device of FIG. 1.
Figure 3:
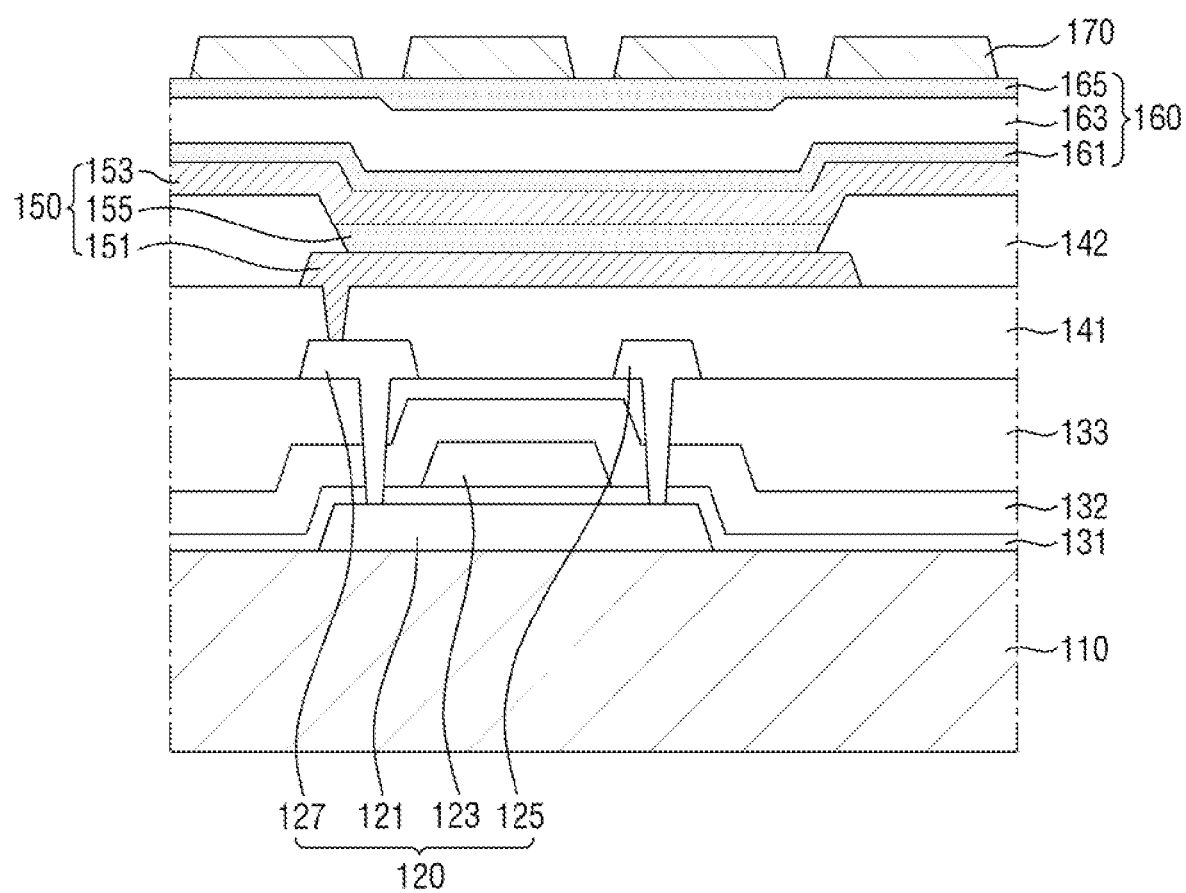
FIG. 3 is a cross-sectional view illustrating an arbitrary pixel of the display panel of FIG. 2.

The display panel 100 will hereinafter be described with reference to FIGS. 2 and 3. FIG. 2 is a perspective view illustrating the display panel 100 of the display device 1 of FIG. 1 and shows the display panel 100 in an unfolded state, instead of a bent state. FIG. 3 is a cross-sectional view illustrating an arbitrary pixel of the display panel of FIG. 2.

Referring to FIGS. 2 and 3, the display panel 100 may further include a panel base 110 and a light-emitting element layer 150, a wiring layer, a thin-film encapsulation layer 160, and a touch coordinate sensor 170. In one exemplary embodiment of the present disclosure, the light-emitting element layer 150 may include an organic light-emitting element, and the display panel 100 may be an organic light-emitting display panel. However, the present disclosure is not limited to this exemplary embodiment.

The panel base 110 may provide a space in which the wiring layer and the light-emitting element layer 150 are to be arranged. The front surface (or the top surface) of the panel base 110 may be disposed on the plane, which may be a plane of the first and second directions X and Y. The panel base 110 may be a transparent or opaque insulating plate or film. For example, the panel base 110 may contain a glass material or a quartz material or may contain a polymer material such as an imide-based resin, a carbonate-based resin, or an acrylic resin. The panel base 110 may be flexible.

The panel base 110 may include a light-emitting element layer supporting portion 111, which provides a space for arranging the light-emitting element layer 150, and a driver integrated circuit (IC) supporting portion 113, which protrudes from the light-emitting element layer supporting portion 111 to provide a space for arranging a driver IC 180. FIG. 2 illustrates the panel base 110 in an unfolded state, but the panel base 110 may be partially bent or folded. For example, the driver IC supporting portion 113 may be bent at least partially in the first direction X, and the driver IC supporting portion 113 and the light-emitting layer supporting portion 111 may face each other when assembled into the display device 1.

A wiring layer including a thin-film transistor (TFT) 120 may be disposed on the light-emitting element layer supporting portion 111 of the panel base 110. FIG. 3 illustrates the wiring layer as including only one TFT 120, but in some exemplary embodiments of the present disclosure, the wiring layer may further include a plurality of TFTs, wires such as scan wires, data wires, and driving voltage lines, and auxiliary electrodes forming capacitors or bridges.

The TFT 120 may be electrically connected to an anode electrode 151 of the light-emitting element layer 150. The TFT 120 may include an active layer 121, which forms a channel, a gate electrode 123, which is a control terminal, a drain electrode 125, which is an input terminal, and a source electrode 127, which is an output terminal. FIG. 2 illustrates an example in which the TFT 120 is a top gate-type TFT in which the gate electrode 123 is disposed above the active layer 121, but alternatively, a bottom gate-type TFT may be used as the TFT 120.

For example, the TFT 120 may be a driving transistor controlling the amount of light emitted by the light-emitting element layer 150 in a particular pixel, but the present disclosure is not limited thereto. For example, alternatively, the TFT 120 may be a switching transistor controlling the turning on or off of the particular pixel, a compensating transistor compensating for a driving signal, an initializing transistor having an initialization signal applied to the gate electrode thereof, or an emission control transistor having an emission control signal applied to the gate electrode thereof. In one exemplary embodiment of the present disclosure, the gate electrode 123 may be electrically connected to the output terminal of a switching transistor, which controls the turning on or off of the particular pixel, and may thus be provided with a control signal, and the drain electrode 125 may be electrically connected to a driving voltage line and may thus be provided with a driving voltage. The source electrode 127 may be electrically connected to the anode electrode 151 of the light-emitting element layer 150. In the active layer 121, a channel through which electrons or holes can move in accordance with a voltage applied to the gate electrode 123, which is a control terminal, may be formed. A first insulating layer 131 may be interposed between the gate electrode 123 and the active layer 121, and a plurality of insulating layers, including second and third insulating layers 132 and 133, may be interposed between the gate electrode 123, the drain electrode 125, and the source electrode 127. The first, second, and third insulating layers 131, 132, and 133 may each contain silicon nitride, silicon oxide, silicon oxynitride, and/or silicon nitrogen oxide.

A height difference compensating layer 141 (e.g. planarization layer) may be disposed on the TFT 120. The height difference compensating layer 141 may have the function of at least partially compensating for height differences formed by the TFT 120 and the like and may provide a space for stably arranging the light-emitting element layer 150 and the like. The material of the height difference compensating layer 141 is not particularly limited as long as it has an insulating property and a planarization property. For example, the height difference compensating layer 141 may contain an organic material such as an acrylic resin, an epoxy resin, an imide resin, a caldo resin, or an ester resin.

The light-emitting element layer 150 may be disposed on the height difference compensating layer 141. The light-emitting element layer 150 may include the anode electrode 151, a cathode electrode 153 spaced apart from the anode electrode 151, and a light-emitting layer 155 interposed between the anode electrode 151 and the cathode electrode 153. The light-emitting layer 155 may contain an organic material, and the light-emitting element layer 150 may be an organic light-emitting element layer. The anode electrode 151 may be a pixel electrode disposed in each pixel and electrically connected to the source electrode 127 of the TFT 120 so as to be able to receive an independent signal for each pixel, and the cathode electrode 153 may be a common electrode disposed across a plurality of pixels. The anode electrode 151 and the cathode electrode 153 may be transparent or opaque. The light-emitting layer 155 may be disposed in each pixel. For example, the light-emitting layer 155 may emit phosphorescent or fluorescent blue light only, phosphorescent or fluorescent green light only, phosphorescent or fluorescent red light only, or white light obtained by mixing phosphorescent or fluorescent blue light, phosphorescent or fluorescent green light, and phosphorescent or fluorescent red light. Although not specifically illustrated, a functional layer such as a hole control layer, an electron control layer, or a charge generating layer may be further interposed between the anode electrode 151 and the cathode electrode 153 to increase the luminous efficiency of the light-emitting element layer 150. In some exemplary embodiments of the present disclosure, a pixel defining layer 142 may be disposed on the anode electrode 151. The pixel defining layer 142 may have an opening partially exposing the anode electrode 151, and the light-emitting layer 155 and the cathode electrode 153 may be disposed on the pixel defining layer 142. The pixel defining film 142 may insulate the anode electrode 151 and the cathode electrode 153 from each other and may define each pixel. The pixel defining layer 142 may contain an organic material such as an acrylic resin, an epoxy resin, an imide resin, or an ester resin.

The thin-film encapsulation layer 160 may be disposed on the light-emitting element layer 150. The thin-film encapsulation layer 160 may prevent the light-emitting layer 155 of the light-emitting element layer 150 from being damaged or deformed by the penetration of moisture or air from outside the display device 1. In one exemplary embodiment of the present disclosure, the thin-film encapsulation layer 160 may include at least one inorganic encapsulation layer, e.g., first and second inorganic encapsulation layers 161 and 165, and at least one organic encapsulation layer, e.g., an organic encapsulation layer 163. For example, the at least one inorganic encapsulation layer and the at least one organic encapsulation layer may be alternately stacked. FIG. 3 illustrates an example in which the thin-film encapsulation layer 160 consists of three layers, but the present disclosure is not limited thereto. In some exemplary embodiments of the present disclosure, the uppermost and lowermost layers of the thin-film encapsulation layer 160 may be the first and second inorganic encapsulation layers 161 and 165, respectively, which contain an inorganic material. The first and second inorganic encapsulation layers 161 and 165 may contain silicon nitride, silicon oxide, silicon oxynitride, and/or silicon nitrogen oxide. The thin-film encapsulation layer 160 may alternatively include any number of organic and inorganic encapsulation layers disposed in any order.

In some exemplary embodiments of the present disclosure, the touch coordinate sensor 170 may be disposed on the second inorganic encapsulation layer 165. For example, the touch coordinate sensor 170 may be disposed directly on the second inorganic encapsulation layer 165 of the thin-film encapsulation layer 160. The touch coordinate sensor 170 may be configured to acquire touch coordinate information of a touch event such as the touch of a user's finger or stylus. For example, the touch coordinate sensor 170 may include a plurality of electrodes spaced apart from one another and may acquire the coordinates of a touch location on a plane in a self-capacitance-type method or a mutual capacitance-type method. The touch coordinate sensor 170 of the display panel 100 may be electrically connected to a touch sensor IC 230 (see, FIG. 5) of a PCB 201.

The driver IC 180 may be disposed on the driver IC supporting portion 113 of the panel base 110. The driver IC 180 may be disposed on a convex surface of the panel base 110 when the driver IC supporting portion 113 of the panel base 110 is bent in the first direction X. The driver IC 180 may generate or modulate an image signal for the display of an image by the display panel 100 based on driving signals provided by an external driver element, for example, the PCB 201, and the driver IC 180 may then transmit or provide the generated or modulated image signal to the TFT 120 via wires in the wiring layer.

FIG. 2 illustrates an example in which part of the panel base 110 of the display panel 100 is bent in the first direction X and thus forms the driver IC supporting portion 113, but the present disclosure is not limited thereto. In an exemplary embodiment of the present disclosure, the display panel 100 may further include a chip-on-film package electrically connecting the PCB 201 and the wiring layer and including the driver IC 180, and the chip-on-film package may form a driver IC supporting portion bent in the first direction X.

In some exemplary embodiments of the present invention, panel pads (or first pads) 190 may be further disposed on the driver IC supporting portion 113 of the panel base 110. The display panel 190 may electrically connect the display panel 100 and the PCB 201. FIG. 2 illustrates an example in which the panel pads 190 are formed by separate electrodes having an expanded area, but the present disclosure is not limited thereto. According to an exemplary embodiment of the present invention, the panel pads 190 may form pads for electrical connection by expanding the ends of wires.

Wires for electrically connecting the driver IC 180 and the TFT 120 of the wiring layer and wires for electrically connecting the driver IC 180 and the panel pads 190 may be further disposed on the panel base 110.

Figure 4:
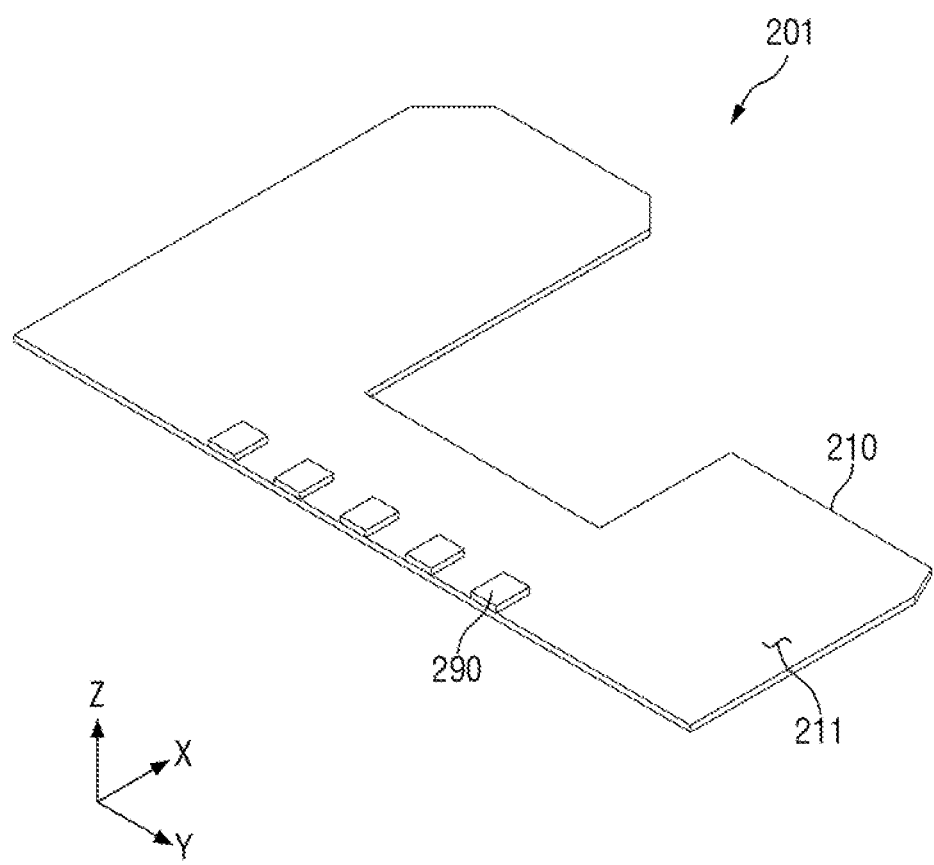
FIG. 4 is a perspective view illustrating a printed circuit board (PCB) of the display device of FIG. 1.
Figure 5:
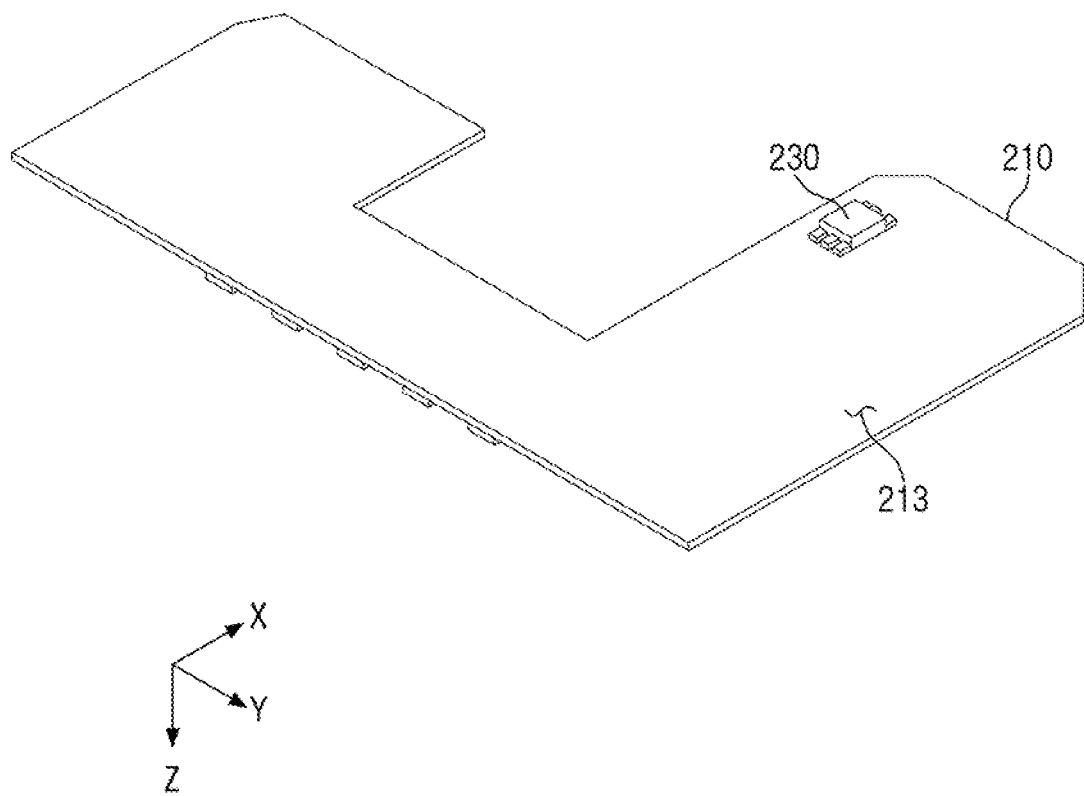
FIG. 5 is a rear perspective view illustrating the PCB of FIG. 4.
Figure 6:
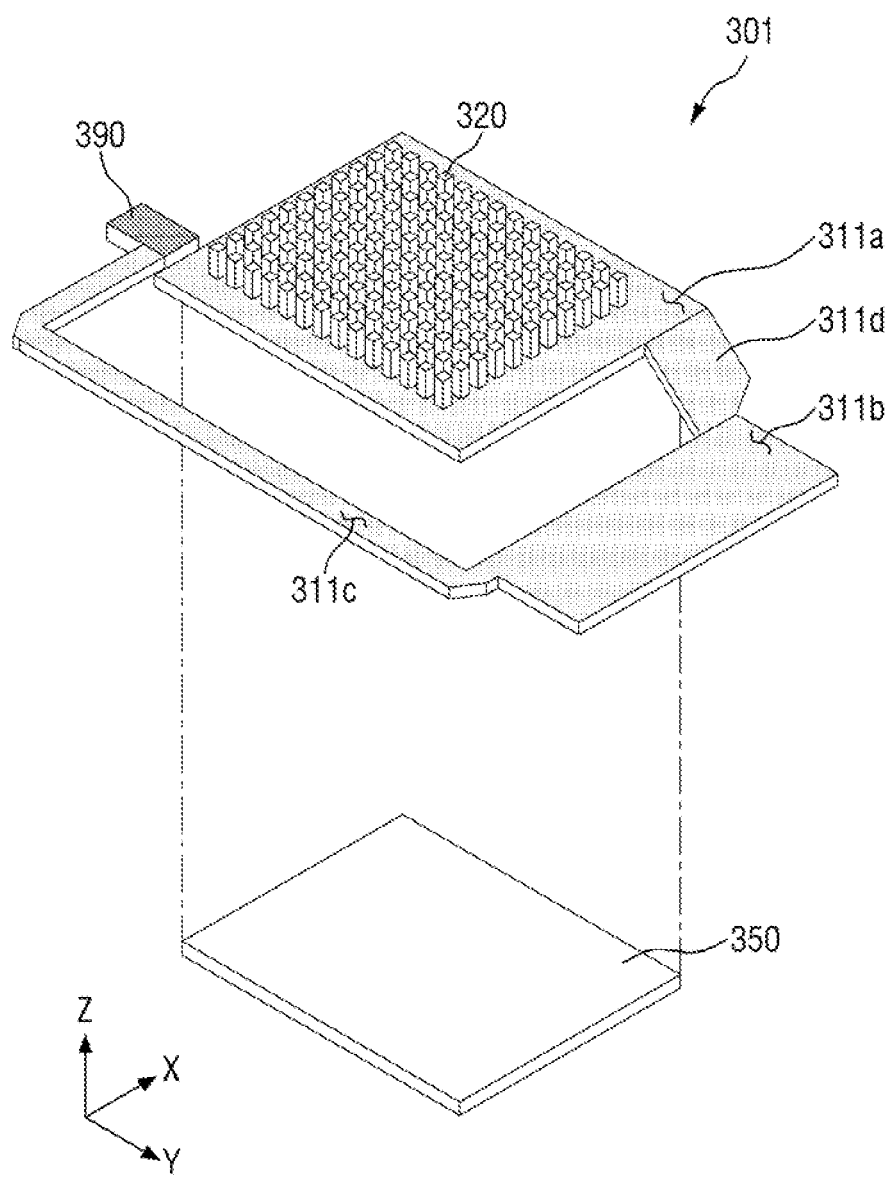
FIG. 6 is a perspective view illustrating a fingerprint sensor package of the display device of FIG. 1.
Figure 7:
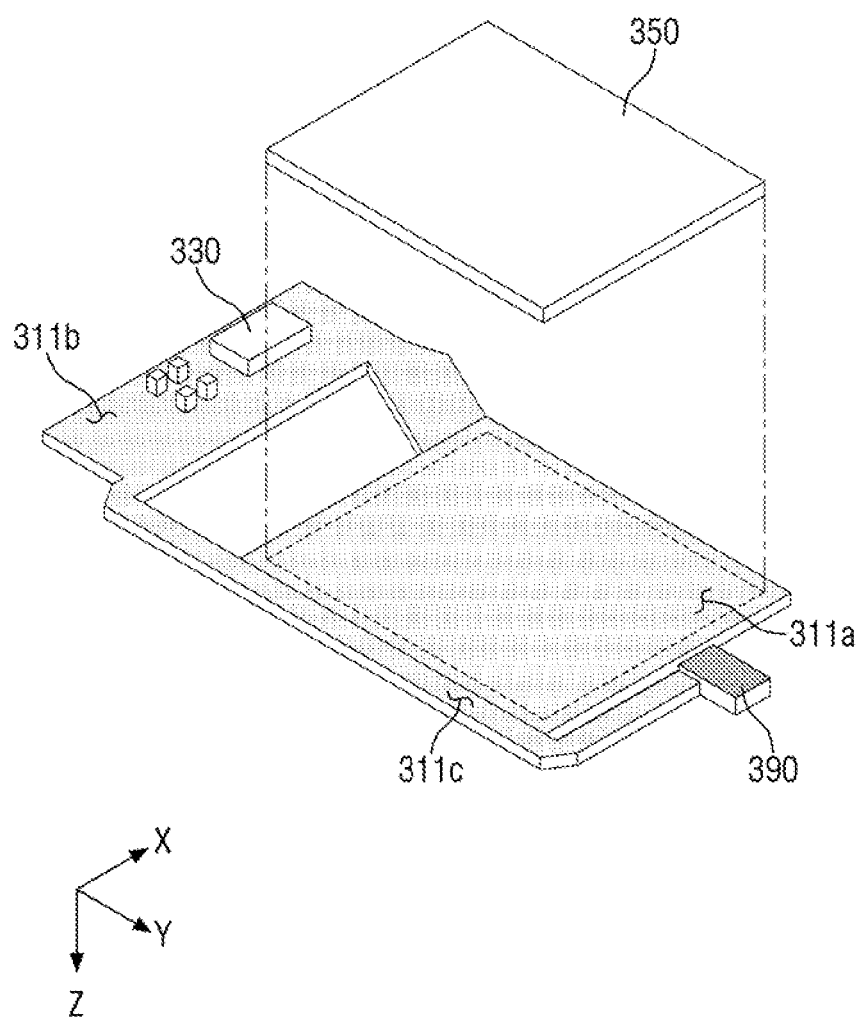
FIG. 7 is a rear perspective view illustrating the fingerprint sensor package of FIG. 6.
Figure 8:
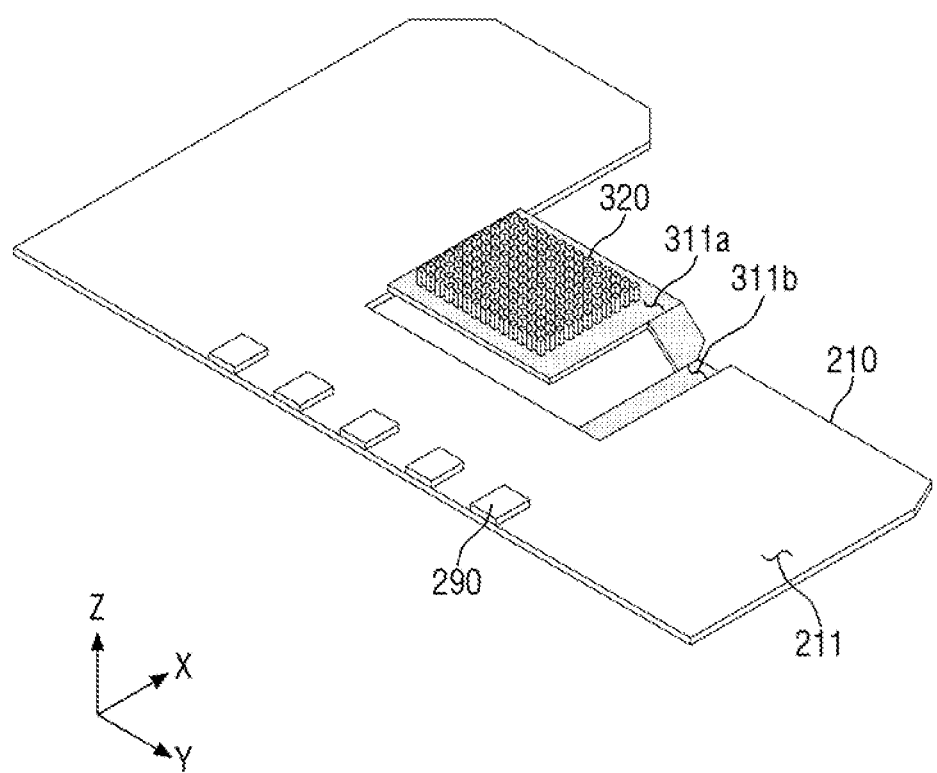
FIG. 8 is a perspective view illustrating an arrangement of the PCB and the fingerprint sensor package of FIG. 1.
Figure 9:
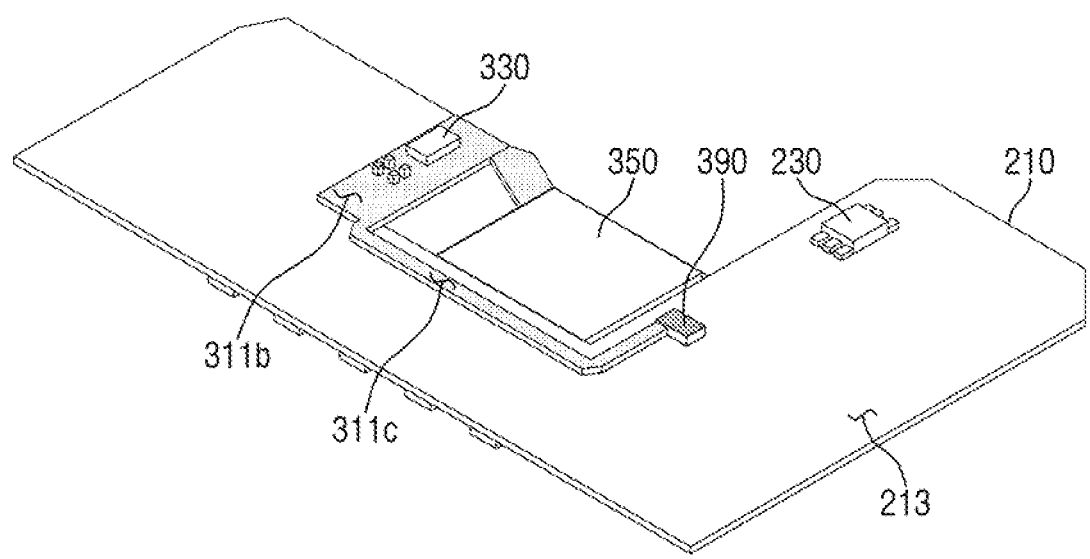
FIG. 9 is a rear perspective view illustrating the PCB and the fingerprint sensor package of FIG. 8.
Figure 10:
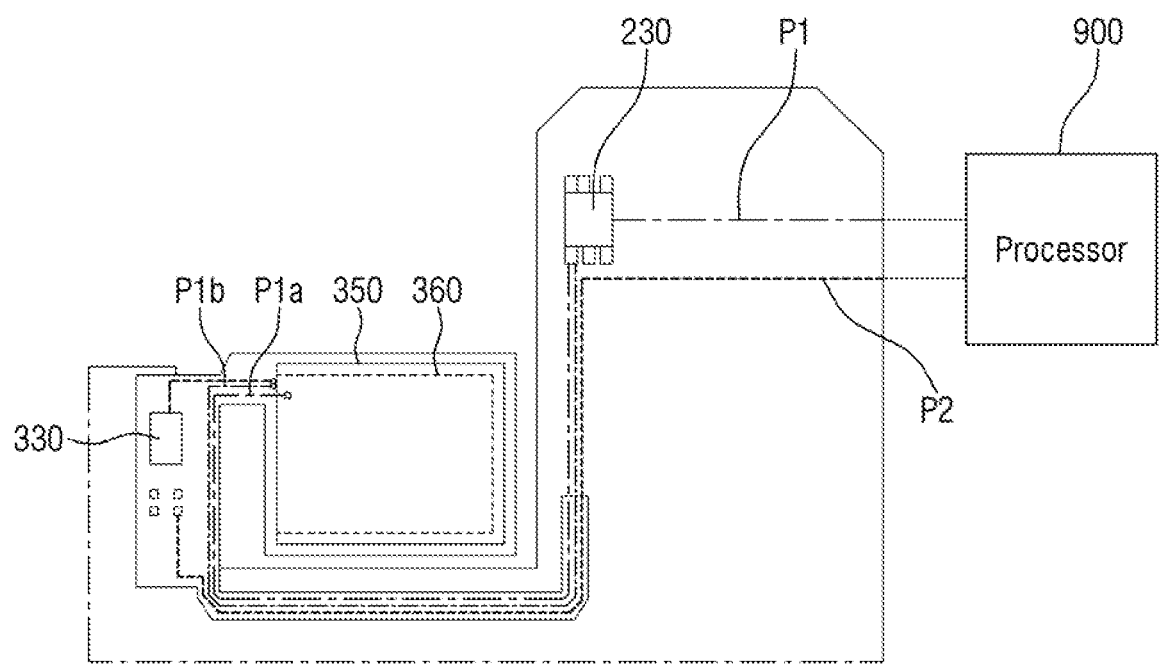
FIG. 10 is a schematic view illustrating paths of transmission of signals of the PCB and the fingerprint sensor package of FIG. 1.

The PCB 201 and the fingerprint sensor package 301 will hereinafter be described with reference to FIGS. 4 through 10. FIG. 4 is a perspective view illustrating the PCB 201 of the display device 1 of FIG. 1. FIG. 5 is a rear perspective view illustrating the PCB 201 of FIG. 4. FIG. 6 is a perspective view illustrating the fingerprint sensor package 301 of the display device 1 of FIG. 1. FIG. 7 is a rear perspective view illustrating the fingerprint sensor package 301 of FIG. 6. FIG. 8 is a perspective view illustrating the arrangement of the PCB 201 and the fingerprint sensor package 301 of FIG. 1. FIG. 9 is a rear perspective view illustrating the PCB 201 and the fingerprint sensor package 301 of FIG. 8. FIG. 10 is a schematic view illustrating paths of transmission of signals of the PCB 201 and the fingerprint sensor package 301 of FIG. 1.

Referring to FIGS. 4 through 10, the PCB 201 and the fingerprint sensor package 301 may be disposed on the rear surface of the display panel 100 (as shown in FIG. 1).

The fingerprint sensor package 301 may include a fingerprint sensor base (or a first base) 311, an image sensor 320 disposed on the front surface (or the top surface) of the fingerprint sensor base 311, and a first conductive layer 350 disposed on the rear surface (or the bottom surface) of the fingerprint sensor base 311.

The PCB 201 may include a circuit board base 210, the touch sensor IC 230 disposed on a rear surface 213 of the circuit board base 210, and circuit board pads (or second pads) 290 disposed on a front surface 211 of the circuit board base 210.

The PCB 201 may be disposed to at least partially overlap the display panel 100 in the third direction Z. The PCB 201 may be disposed so as not to overlap with either the image sensor 320 or the first conductive layer 350 of the fingerprint sensor package 301.

The PCB 201 may generate or modulate an image display signal for the display of an image by the display panel 100, based on a signal provided from an external processor 900 (see, FIG. 10), and may provide or transmit the generated or modulated signal to the display panel 100.

The circuit board base 210 of the PCB 201 may be a transparent or opaque supporting member providing a space in which the touch sensor IC 230 and the like are to be arranged. The circuit board base 210 may include an insulating film or plate. For example, the circuit board base 210 may contain a polymer material such as polyimide, polyepoxy, or polyester. The front surface 211 of the circuit board base 210 may face the display panel 100, and the rear surface 213 of the circuit board base 210 may face the rear cover 401.

In some exemplary embodiments of the present disclosure, the circuit board base 210 may include conductive patterns. The conductive patterns may be conductive wires electrically connecting electric elements in the PCB 201. For example, the conductive patterns of the circuit board base 210 may electrically connect the fingerprint sensor base 311 of the fingerprint sensor package 301 and the touch sensor IC 230 or may electrically connect the fingerprint sensor base 311 and the external processor 900.

The touch sensor IC 230 may be disposed on the rear surface 213 of the circuit board base 210. The touch sensor IC 230 may process information regarding the touch event. For example, the touch sensor IC 230 may be electrically connected to the touch coordinate sensor 170 of the display panel 100 and the first conductive layer 350 of the fingerprint sensor package 301, and may process touch location information acquired by the touch coordinate sensor 170 and touch pressure information acquired by a pressure sensor FS1 that will be described later.

The circuit board pads 290 may be disposed on the front surface 211 of the circuit board base 210. The circuit board pads 290 may electrically connect the PCB 201 and the display panel 100. FIG. 4 illustrates an example in which the circuit board pads 290 are formed by separate electrodes over an expanded area, but the present disclosure is not limited thereto. For example, the circuit board pads 290 may form pads for electrical connection by expanding the ends of wires.

The panel pads 190 of the display panel 100 and the circuit board pads 290 of the PCB 201 may be electrically connected to each other. For example, the panel pads 190 and the circuit board pads 290 may be directly connected to each other by thermal compression. For example, the panel pads 190 and the circuit board pads 290 may be indirectly connected to each other by interposing an anisotropic conductive film therebetween.

The fingerprint sensor package 301 may be disposed to at least partially overlap with the display panel 100 in the third direction Z. For example, the image sensor 320 of the fingerprint sensor package 301 may be disposed to overlap with the display panel 100. The image sensor 320 may be disposed so as not to overlap with the PCB 201.

The fingerprint sensor base 311 of the fingerprint sensor package 301 may be a transparent or opaque supporting member providing a space in which the image sensor 320 and the first conductive layer 350 are to be arranged. The fingerprint sensor base 311, like the circuit board base 210, may be an insulating film or plate. According to some exemplary embodiments of the present disclosure, the fingerprint sensor base 311 may be flexible.

The fingerprint sensor base 311 of the fingerprint sensor package 301 may include various conductive patterns. The conductive patterns may include conductive wires electrically connecting electric elements in the fingerprint sensor package 301. For example, the conductive patterns of the fingerprint sensor base 311 may electrically connect the circuit board base 210 of the PCB 201 to the image sensor 320 or may electrically connect the circuit board base 210 to the first conductive layer 350.

The fingerprint sensor base 311 may include an image sensor supporting portion 311a, a first connector portion 311d, an image sensor IC supporting portion 311b, a second connector portion 311c, and a connector 390. The image sensor supporting portion 311a may provide a space for receiving the image sensor 320. The first connector portion 311d may protrude or extend obliquely from one surface to the other surface of the image sensor supporting portion 311a. The image sensor IC supporting portion 311b may be connected to the first connector portion 311d, may extend in parallel with the one surface of the image sensor supporting portion 311a, and may provide a space for receiving the image sensor IC 330. The second connector portion 311c may extend from a side to another side of the image sensor supporting portion 311a along edge of the image sensor supporting portion 311a and may electrically connect the image sensor IC 330 and the connector 390. The connector 390 may protrudes from the second connector portion 311c and may be connected to the PCB 201.

According to an exemplary embodiment of the present disclosure, the fingerprint sensor base 311 may be at least partially bent or folded.

The image sensor supporting portion 311a of the fingerprint sensor base 311 may be disposed at a higher level than that of the circuit board base 210 of the PCB 201. That is the image sensor supporting portion 311a of the fingerprint sensor base 311 may be located a higher position in the third direction Z than the circuit board base 210 of the PCB 201. For example, the image sensor supporting portion 311a of the fingerprint sensor base 311 may be located in an opening 600h (see, FIG. 1) of the rear sheet member 600. The image sensor supporting portion 311a of the fingerprint sensor base 311 might not overlap with the PCB 201 in the third direction Z. Accordingly, the image sensor 320 can be coupled to the display panel 100.

The image sensor IC supporting portion 311b and the second connector portion 311c of the fingerprint sensor base 311 may at least partially overlap with the circuit board base 210 of the PCB 201 in the third direction Z and may be disposed at a lower location in the third direction Z than the circuit board base 210 of the PCB 201. For example, a first connector portion 311d of the fingerprint sensor base 311 between the image sensor supporting portion 311a and the image sensor IC supporting portion 311b may be bent or folded, and the front surfaces of the image sensor IC supporting portion 311b and the second connector portion 311c may face the rear surface 213 of the circuit board base 210. The connector 390 of the second connector portion 311c may be electrically connected to the conductive patterns on the rear surface 213 of the circuit board base 210. For example, the connector 390 of the fingerprint sensor package 301 may electrically connect the conductive patterns of the fingerprint sensor baes 311 and the conductive patterns of the circuit board base 210.

The image sensor 320 may be disposed on the front surface of the image sensor supporting portion 311a of the fingerprint sensor base 311. The image sensor 320 may acquire information regarding the shape, the location, or the motion of a particular object by receiving light incident thereupon and acquiring information regarding the amount of incident light or the amount of time that it takes for the incident light to arrive. For example, the image sensor 320 may acquire the shape of a fingerprint of the user, e.g., the pattern of a fingerprint of the user, by detecting an electrical signal corresponding to the amount of light received. For example, the image sensor 320 may detect an electrical signal corresponding to the amount of light received and may thus acquire image information of a fingerprint pattern based on brightness information of the ridges and valleys of a fingerprint of the user. In one exemplary embodiment of the present disclosure, the image sensor 320 may include a phototransistor, a photodiode, or a photoresistor. In some exemplary embodiments of the present disclosure, the image sensor 320 may include a charged coupled device (CCD) image sensor or a complementary metal oxide semiconductor (CMOS) image sensor.

The image sensor 320 may be electrically connected to the conductive patterns of the fingerprint sensor base 311 and may also be electrically connected to the image sensor IC 330.

The image sensor IC 330 may be disposed on the rear surface of the image sensor IC supporting portion 311b of the fingerprint sensor base 311. The image sensor IC 330 may process image information of a fingerprint pattern detected by the image sensor 320. For example, the image sensor IC 330 may be electrically connected to the conductive patterns of the fingerprint sensor base 311, and the image sensor IC 330 may be electrically connected to the circuit board base 210.

The first conductive layer 350 may be disposed on the rear surface of the image sensor supporting portion 311a of the fingerprint sensor base 311. The first conductive layer 350 may be disposed to at least partially overlap with the image sensor 320 in the third direction Z. The first conductive layer 350 may form the pressure sensor FS1 together with the rear cover 401 and an air layer AG, which is interposed between the first conductive layer 350 and the rear cover 401. Here, the air layer AG may be empty. The pressure sensor FS1 may acquire touch pressure information of the user.

The image sensor 320 and the pressure sensor FS1 may be disposed to overlap in the third direction Z. For example, a pressure sensing area and a fingerprint sensing area can be unified by arranging the first conductive layer 350, which forms the pressure sensor FS1, to overlap with the image sensor 320. Also, an area where the display of an image is performed, an area where touch pressure information can be acquired, and an area where fingerprint pattern information can be acquired can be part of a single structure by arranging the pressure sensing area and the fingerprint sensing area within the display area of the display panel 100. Also, fingerprint information and pressure information can both be acquired at the same time from a single touch event where the user touches a surface of the display device 1 (for example, the front surface of the window 500). For example, the image sensor 320 may be configured to be activated for a predetermined amount of time in response to effective pressure being applied to the pressure sensor FS1, or may be configured to be activated only when effective pressure is being applied to the pressure sensor FS1, but the present disclosure is not limited thereto. Here, "effective pressure" may be understood to mean pressure over a predetermined threshold, that may be indicative of a voluntary touch. The pressure sensor FS1 may be configured to perform functions other than that of activating the image sensor 320, or the image sensor 320 may be configured to be activated by another initiation operation.

The first conductive layer 350 may be electrically connected to the conductive patterns of the fingerprint sensor base 311. For example, the first conductive layer 350 may be electrically connected to the conductive patterns of the fingerprint sensor base 311 via a via electrode 340. The first conductive layer 350 may be electrically connected to the circuit board base 210 and to the touch sensor IC 230 and may thus receive a driving signal for driving the pressure sensor FS1 from the touch sensor IC 230. For example, the first conductive layer 350 may be a first electrode or a driving electrode of the pressure sensor FS1.

In some exemplary embodiments of the present disclosure, the area occupied by the first conductive layer 350 may be larger than the area occupied by the image sensor 320, and the first conductive layer 350 may completely cover the image sensor 320. By arranging the first conductive layer 350 to completely cover the image sensor 320, touch pressure information can be sensed with the use of the first conductive layer 350, even when a finger of the user is not placed precisely above the image sensor 320.

As mentioned above, the image sensor 320 may be electrically connected to the image sensor IC 330 via the fingerprint sensor base 311, and the image sensor IC 330 may be electrically connected to the PCB 201 via the conductive patterns of the fingerprint sensor base 311. Also, the first conductive layer 350 may be electrically connected to the touch sensor IC 230 of the PCB 201 via the conductive patterns of the fingerprint sensor base 311.

A shielding electrode layer 360 may be disposed between the fingerprint sensor base 311 and the first conductive layer 350, and the shielding electrode layer 360 and the first conductive layer 350 may be insulated from each other by an insulating layer 370 interposed therebetween. The shielding electrode layer 360 may be disposed to at least partially overlap with the image sensor 320 and the first conductive layer 350 in the third direction Z. The via electrode 340, which electrically connects the first conductive layer 350 and the conductive patterns of the fingerprint sensor base 311, may partially penetrate the insulating layer 370.

The shielding electrode layer 360 may be electrically connected to the conductive patterns of the fingerprint sensor base 311. Also, the shielding electrode layer 360 may be electrically connected to the circuit board base 210 and to the touch sensor IC 230.

In one exemplary embodiment of the present disclosure, the period of a signal applied to the shielding electrode layer 360 may be substantially the same as the period of a signal applied to the first conductive layer 350. In a non-limiting example, a driving signal applied to the first conductive layer 350, which forms the pressure sensor FS1, may be a pulse wave having a predetermined period, and a shielding signal applied to the shielding electrode layer 360 may be a pulse wave having an opposite displacement to, and having the same period as, the driving signal applied to the first conductive layer 350.

As mentioned above, a driving signal for driving the pressure sensor FS1 may be applied to the first conductive layer 350, and the driving signal applied to the first conductive layer 350 may form parasitic capacitance with the image sensor 320. Since in the fingerprint sensor package 301, the shielding electrode layer 360 is interposed between the first conductive layer 350 and the image sensor 320, particularly, between the first conductive layer 350 and the fingerprint sensor base 311, the formation of parasitic capacitance can be suppressed.

In one exemplary embodiment of the present disclosure, the display device 1 may further include the processor 900, and the image sensor IC 330 and the touch sensor IC 230 may receive signals from the processor 900. For example, the processor 900 may provide signals for controlling the operations of the touch sensor IC 230 and the image sensor IC 330. The touch sensor IC 230 may provide a signal to the first conductive layer 350, and the image sensor IC 330 may provide a signal to the image sensor 320. In some exemplary embodiments of the present disclosure, the touch sensor IC 230 and the image sensor IC 330 may be connected to the processor 900 via different paths (P1 and P2). For example, a first channel P1, connected between the touch sensor IC 230 and the processor 900, and a second channel P2, connected between the image sensor IC 330 and the processor 900, may differ from each other. As mentioned above, the pressure sensor FS1 may be configured to initiate the activation of the image sensor 320 or perform functions other than that of activating the image sensor 320, and the image sensor 320 may be configured to be activated by another initiation operation. Since the first channel P1, via which a signal is provided to the touch sensor IC 230, and the second channel P2, via which a signal is provided to the image sensor IC 330, are separated from each other, the pressure sensor FS1 and the image sensor 320 can be configured to operate independently. A conductive pattern path P1a is connected between the touch sensor IC 230 and the first conductive layer 350 and a conductive pattern path P1b is connected between the touch sensor IC 230 and the shielding electrode layer 360. For example, signals provided from the processor 900 to the touch sensor IC 230 via the first channel P1 may be separated from one another and may be provided to the first conductive layer 350 and the shielding electrode layer 360 via different conductive pattern paths, e.g., the first and second conductive pattern paths P1a and P1b.

Figure 11:
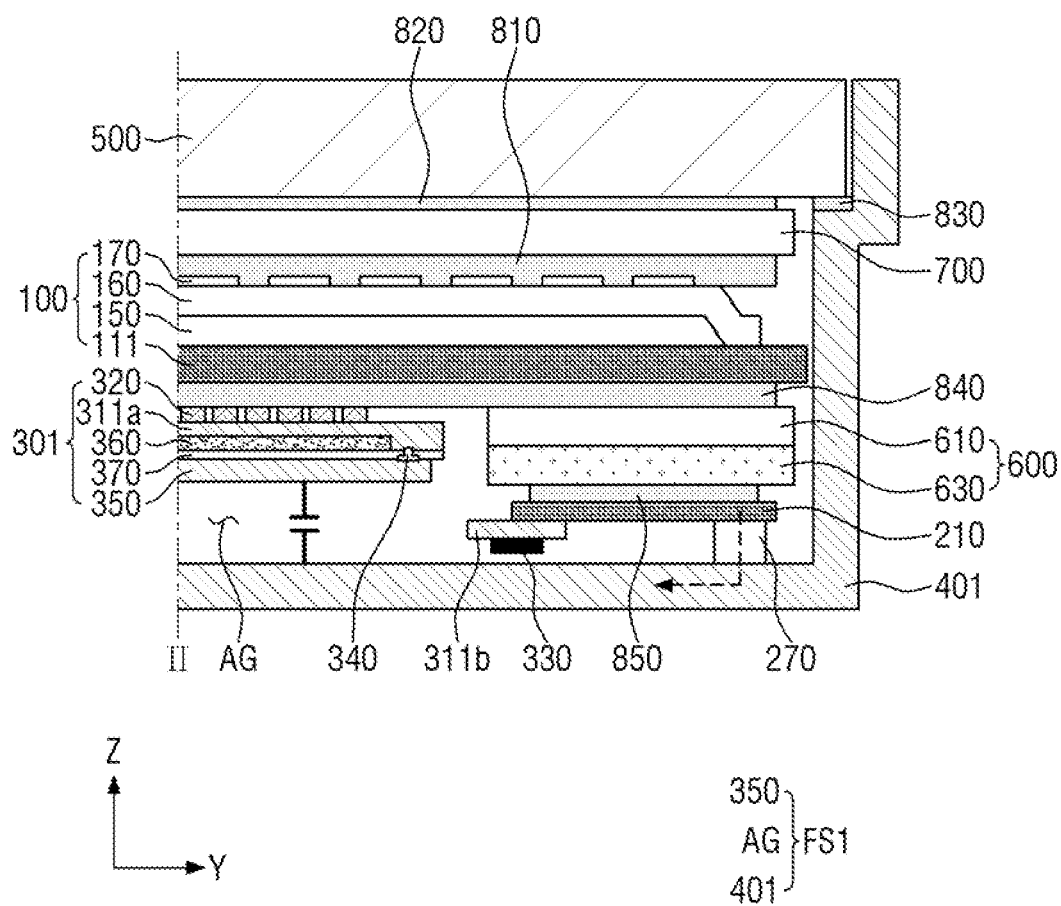
FIG. 11 is a cross-sectional view taken along line II-II' of FIG. 1.
Figure 12:
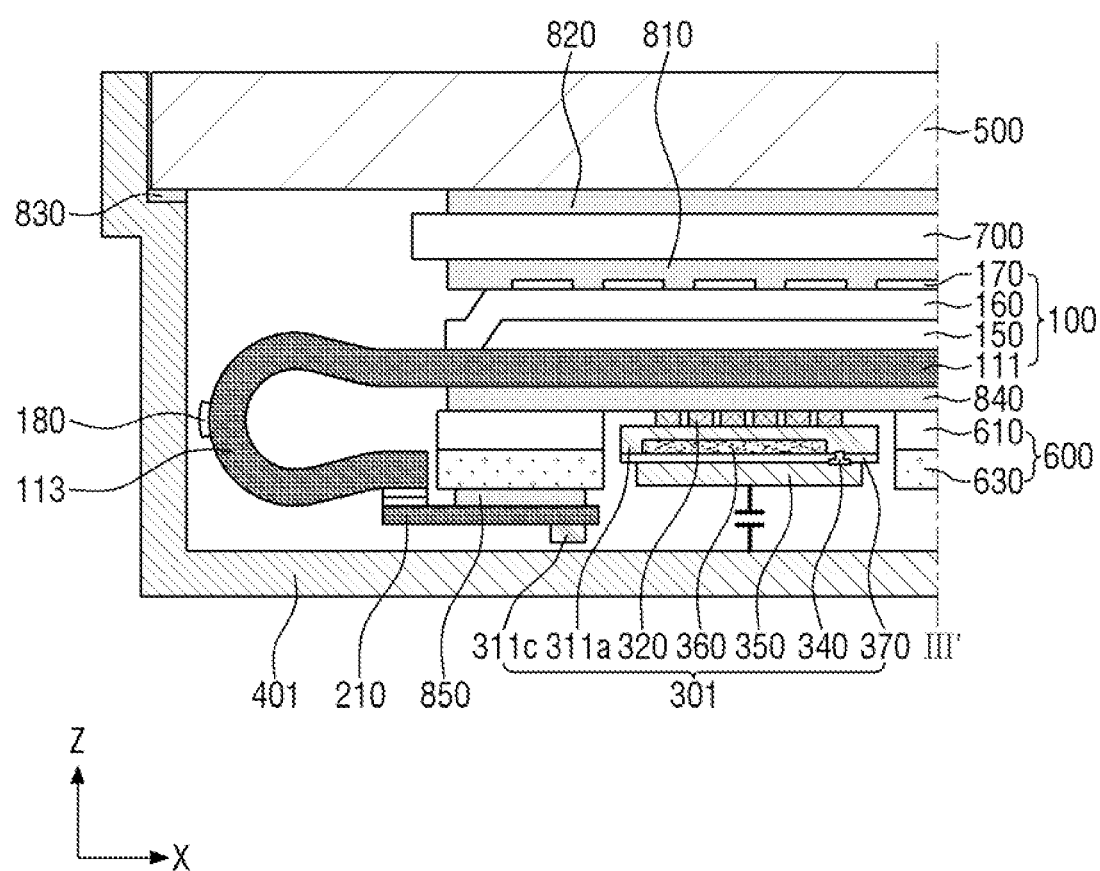
FIG. 12 is a cross-sectional view taken along line III-III' of FIG. 1.

FIG. 11 is a cross-sectional view taken along line II-II' of FIG. 1. FIG. 12 is a cross-sectional view taken along line III-III' of FIG. 1.

Referring to FIGS. 1, 11, and 12, the rear cover 401 may be disposed on the rear surface of the PCB 201. The rear cover 401 may be configured to receive the display panel 100, the PCB 201, and the fingerprint sensor package 301. For example, in a plan view, the sidewalls of the rear cover 401 may at least partially surround the window 500, the display panel 100, the PCB 201, and the fingerprint sensor package 301. The rear cover 401, together with the window 500, may cover and protect the elements of the display device 10.

In one exemplary embodiment of the present disclosure, the rear cover 401 may be an electrically conductive rear cover. For example, the rear cover 401 may contain a material with high strength and rigidity and high electrical conductivity, e.g., a metal such as aluminum (Al), copper (Cu), nickel (Ni), or an alloy thereof.

The rear cover 401, which is electrically conductive, may be electrically connected to the conductive patterns of the circuit board base 210. For example, the rear cover 401 may be electrically connected to the conductive patterns of the circuit board base 210 via a conductor 270. The rear cover 401 may receive a ground signal from the touch sensor IC 230. For example, the rear cover 401 may be a second conductive electrode or a ground electrode of the pressure sensor FS1.

The rear cover 401 may be spaced apart from the first conductive layer 350 of the fingerprint sensor package 301, and the air layer AG may be interposed between the rear cover 401 and the first conductive layer 350. The rear cover 401 may form the pressure sensor FS1 together with the first conductive layer 350 of the fingerprint sensor package 301 and the air layer AG, which is interposed between the first conductive layer 350 and the rear cover 401. For example, the first conductive layer 350, the rear cover 401, and the air layer AG may form a capacitor. The capacitance generated between the first conductive layer 350 and the rear cover 401 may be determined by the distance between the first conductive layer 350 and the rear cover 401. In an initial state where pressure is yet to be applied to the pressure sensor FS1, initial capacitance may be generated between the first conductive layer 350 and the rear cover 401. In a pressurized state where pressure is applied to the pressure sensor FS1, pressure capacitance may be generated between the first conductive layer 350 and the rear cover 401. The touch sensor IC 230 may acquire information indicating whether the touch event involves pressure based on the difference between the pressure capacitance and the initial capacitance.

For example, if the difference between the pressure capacitance and the initial capacitance exceeds a reference value (or a threshold value), the touch sensor IC 230 may determine that a touch event involving pressure has been performed. On the other hand, if the difference between the pressure capacitance and the initial capacitance does not exceed the reference value, the touch sensor IC 230 may determine that a touch event not involving pressure has been performed.

The window 500 may be disposed on the front surface of the display panel 100. The window 500 may protect the display panel 100 and form the exterior of the display device 1 by covering the top surface of the display panel 100. The window 500 may form a display surface on which an image is displayed by the display device 1, and at the same time, form a touch surface where the touch event, e.g., the contact between the user and the display device 1, occurs. In a case where the touch event is performed by a finger of the user, the front surface of the window 500 may be placed in contact with the user's fingerprint pattern. The material of the window 500 may be made of various different materials as long as the window 500 is clear and strong. For example, the window 500 may include a glass, sapphire, or a polymer plate.

In some exemplary embodiments of the present disclosure, a polarizing member 700 may be further disposed between the display panel 100 and the window 500. The polarizing member 700 may increase the outdoor visibility of the display device 1. For example, the polarizing member 700 may minimize reflected light from an external light source from being viewed by the user by circularly polarizing non-polarized external incident light and preventing the circularly polarized light from being reflected and emitted again. FIG. 2 illustrates an example in which the polarizing member 700 consists of a single layer, but the polarizing member 700 may include a stack of a linearly polarizing member and a phase retarder member.

The display panel 100 and the window 500 may be coupled and fixed to each other. As used herein, the expression "elements are fixed" means that the elements are directly or indirectly coupled so that the relative locations of the elements can be kept constant or "fixed". For example, as used herein, the expression "elements are fixed" not only covers the arrangement in which the elements are placed in direct contact with, and directly coupled to, each other, but also covers arrangements in which the elements are directly coupled to each other with one or more bonding or coupling layers interposed therebetween so that the relative locations of the elements can be fixed.

For example, one or more bonding layers (810 and 820) may be interposed between the display panel 100 and the window 500. For example, a first bonding layer 810 may be interposed between the display panel 100 and the polarizing member 700 to couple the display panel 100 and the polarizing member 700, and a second bonding layer 820 may be interposed between the polarizing member 700 and the window 500 to couple the polarizing member 700 and the window 500. The first and second bonding layers 810 and 820 may contain an optically clear adhesive (OCA), an optically clear resin (OCR), a pressure sensitive adhesive (PSA), or a double-sided tape.

The window 500 and the rear cover 401 may be coupled and fixed to each other. For example, a third bonding layer 830 may be interposed between the edges of the window 500 and the sidewalls of the rear cover 401 to couple the window 500 and the rear cover 401. The third bonding layer 830 may contain an OCA, an OCR, a PSA, or a double-sided tape.

In some exemplary embodiments of the present disclosure, the rear sheet member 600 may be disposed on the rear surface of the display panel 100. The rear sheet member 600 may at least partially overlap the display area of the display panel 100. In one exemplary embodiment of the present disclosure, the rear sheet member 600 may include a cushion sheet element 610 and a metal sheet element 630. FIG. 2 illustrates an example in which the rear sheet element 600 has a stack of two sheets, but the present disclosure is not limited thereto. For example, a third sheet may be further interposed between the cushion sheet member 610 and the metal sheet member 630.

For example, the cushion sheet member 610 may be disposed in the uppermost layer of the rear sheet member 600. The cushion sheet member 610 may suppress damage caused by external impact to the display panel 100. The cushion sheet member 610 may absorb or distribute at least part of external impact and may thus protect the display panel 100. The cushion sheet member 610 may include various materials as long as it is suitable for absorbing and/or distributing impact. For example, the cushion sheet member 610 may contain a polymer material such as a urethane-based resin, a carbonate-based resin, a propylene-based resin, or an ethylene-based resin, a rubber-based material, or a foamed product thereof.

The metal sheet member 630 may be disposed in the lowermost layer of the rear sheet member 600. The metal sheet member 630 may strengthen the display device 1 or may dissipate heat and/or provide electromagnetic shielding. The metal sheet member 630 may include various materials as long as it has a predetermined rigidity and strength and has heat transmission and electromagnetic shielding functions. For example, the metal sheet member 630 may contain copper (Cu), nickel (Ni), ferrite, silver (Ag), or an alloy thereof.

In some exemplary embodiments of the present disclosure, the cushion sheet member 610 and the metal sheet member 630 may have the opening 600*h* in which the fingerprint sensor package 301 is to be inserted. For example, the image sensor 320 of the fingerprint sensor package 301 may be inserted in the opening 600*h* of the rear sheet member 600. For example, in a plan view, the rear sheet member 600, which includes the cushion sheet member 610 and the metal sheet member 630, may be disposed so as not to overlap with the image sensor 320. The image sensor supporting portion 311*a* of the fingerprint sensor base 311 may be inserted in the opening 600*h* of the rear sheet member 600. The sensing sensitivity of the image sensor 320 may be increased by not interposing the rear sheet member 600 between the display panel 100 and the image sensor 320.

The display panel 100 and the rear sheet member 600 may be coupled and fixed to each other, and the display panel 100 and the fingerprint sensor package 301 may be coupled and fixed to each other. For example, a fourth bonding layer 840 may be interposed between the display panel 100 and the rear sheet member 600 and between the display panel 100 and the fingerprint sensor package 301. The fourth bonding layer 840 may contain an OCA, an OCR, a PSA, or a double-sided tape.

The rear sheet member 600 and the PCB 201 may be coupled and fixed to each other. For example, a fifth bonding layer 850 may be interposed between the rear sheet member 600 and the circuit board base 210 of the PCB 201 to couple the rear sheet member 600 and the circuit board base 210. The fifth bonding layer 850 may contain an OCA, an OCR, a PSA, or a double-sided tape.

As mentioned above, the window 500 may be fixed to the display panel 100, and the display panel 100 may be fixed to the fingerprint sensor package 301. For example, the window 500 and the fingerprint sensor package 301, which overlap with each other in the third direction Z, may be coupled to each other by interposing the first, second, and fourth bonding layers 810, 820, and 840 between the window 500 and the fingerprint sensor package 301 so that the relative locations of the window 500 and the fingerprint sensor package 301 may be fixed. Accordingly, the pressure applied to the touch surface (for example, the front surface of the window 500) may be delivered to the first conductive layer 350 of the fingerprint sensor package 301. The window 500 and the rear cover 401 may be fixed to each other. For example, the window 500 and the rear cover 401 may be coupled to each other by interposing the third bonding layer 830 between the window 500 and the rear cover 401 so that the relative locations of the window 500 and the rear cover 401 may be fixed.

In a structure for fixing the first conductive layer 350, which forms the first electrode of the pressure sensor FS1, and the rear cover 401, which forms the second electrode of the pressure sensor FS1, the first conductive layer 350 and the rear cover 401 may be fixed through the window 500 while keeping the rear surface of the first conductive layer 350 free. As a result, the distance between the first conductive layer 350 and the rear cover 401 can be variably set using the elasticity of the window 500, the display panel 100, and the fingerprint sensor base 311, and the pressure sensor FS1 can be formed without the need of an additional elastic layer between the first conductive layer 350 and the rear cover 401.

In a case where the PCB 201 is interposed between the first conductive layer 350 of the pressure sensor FS1 and the display panel 100, the PCB 201 may continue to be pressed due to the pressure applied during the touch event, and as a result, damage may be caused to various elements for driving the touch sensor IC 230 and the display device 1, thereby degrading the reliability and the durability of the display device 1.

In the display device 1, the first conductive layer 350 of the pressure sensor FS1 and the circuit board base 210 may be disposed so as not to overlap, and the image sensor IC supporting portion 311*b* and the second connector portion 311*c* of the fingerprint sensor base 311 may be disposed at a lower level than the circuit board base 210. Thus, even when pressure is applied from above the fingerprint sensor package 301, pressure is still delivered to the PCB 201 in a vertical direction.

Display devices according to exemplary embodiments of the present disclosure will hereinafter be described. To the extent that descriptions of elements or features tare omitted, it may be understood that these elements are at least similar to corresponding elements that have been described above with respect to the display device 1.

Figure 13:
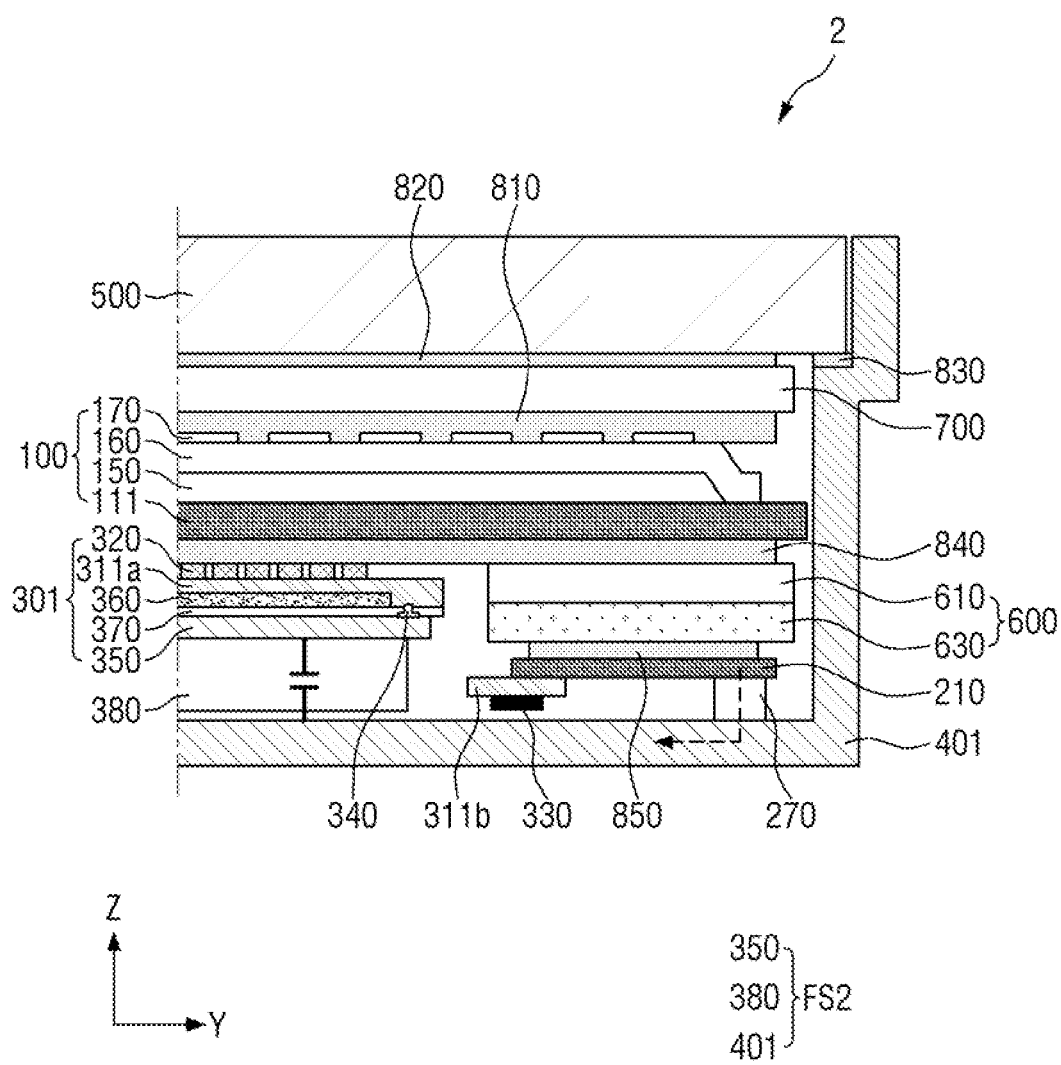
FIGS. 13 and 14 are cross-sectional views illustrating a display device according to an exemplary embodiment of the present disclosure.
Figure 14:
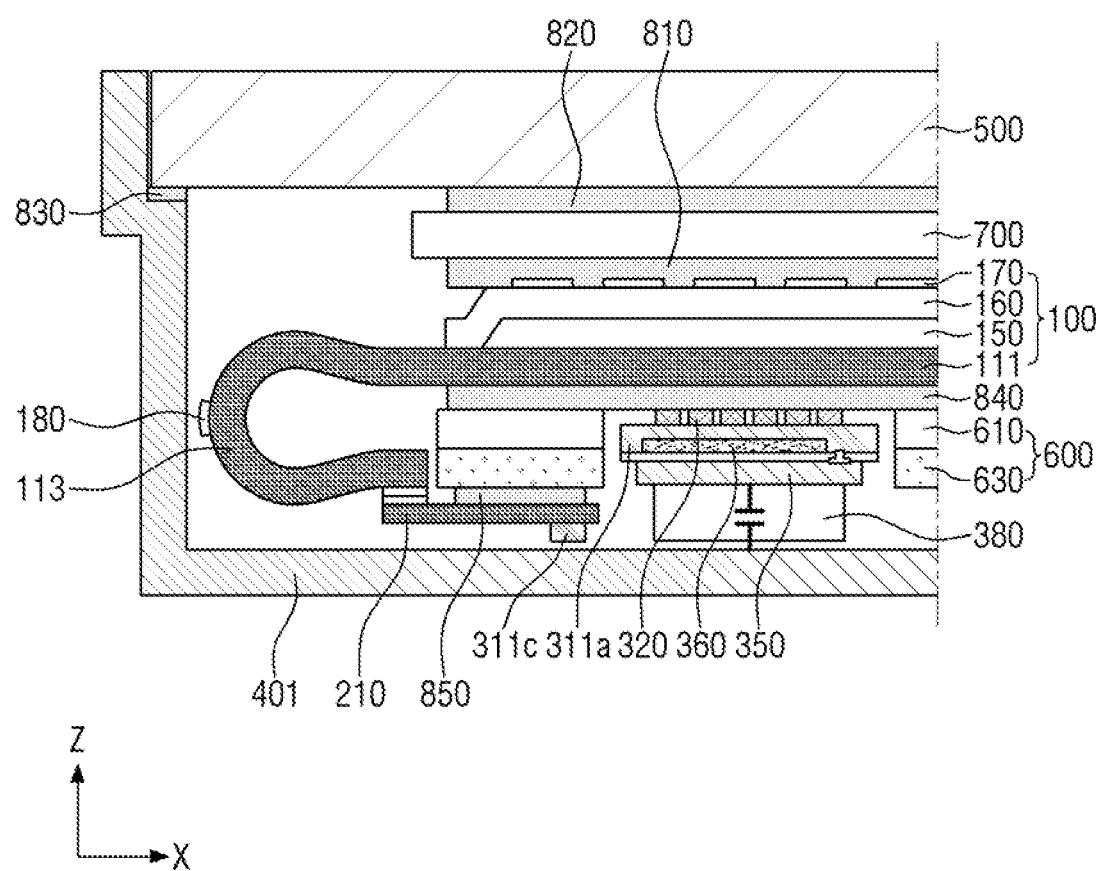

FIGS. 13 and 14 are cross-sectional views of a display device 2 according to an exemplary embodiment of the present disclosure. For example, FIG. 13 is a cross-sectional view illustrating a part of the display device 2 at a location corresponding to FIG. 11, and FIG. 14 is a cross-sectional view illustrating a part of the display device 2 at a location corresponding to FIG. 12.

Referring to FIGS. 13 and 14, the display device 2 differs from the display device 1 in that it further includes an elastic body 380 disposed between a first conductive layer 350 of a fingerprint sensor package 301 and a conductive rear cover 401.

The elastic body 380 may be interposed between the first conductive layer 350, which forms a pressure sensor FS2, and the conductive rear cover 401 and may fill at least part of the gap between the first conductive layer 350 and the conductive rear cover 401. For example, the elastic body 380 may be placed in contact with the first conductive layer 350, and an air layer may be interposed between the elastic body 380 and the conductive rear cover 401. The first conductive layer 350, the conductive rear cover 401, the elastic body 380, and the air layer may form the pressure sensor FS2 together. For example, the elastic body 380 and the air layer may form a serial capacitor. According to an exemplary embodiment of the present disclosure, the elastic body 380 may be placed in contact with both the first conductive layer 350 and the conductive rear cover 401.

The elastic body 380 may be coupled to either the first conductive layer 350 or the conductive rear cover 401. FIG. 13 illustrates an example in which the elastic body 380 is coupled to the first conductive layer 350 but not the conductive rear cover 401. However, alternatively, the elastic body 380 may be coupled to the conductive rear cover 401 but not the first conductive layer 350. The elastic body 380 may be coupled to either the first conductive layer 350 or the conductive rear cover 401, which form a driving electrode and a ground electrode of the pressure sensor FS2, thereby simplifying the assembly of the display device 2.

In some exemplary embodiments of the present disclosure, the area occupied by the elastic body 380 may be smaller than the area occupied by the first conductive layer 350. For example, the width, in the first direction X, of the elastic body 380 may be smaller than the width, in the first direction X, of the first conductive layer 350, and the width, in the second direction Y, of the elastic body 380 may be smaller than the width, in the second direction Y, of the first conductive layer 350. The sensing precision and the sensing sensitivity of the pressure sensor FS2 can be increased by forming the elastic body 380, which has a predetermined dielectric constant and forms the pressure sensor FS2, with a smaller area than the first conductive layer 350.

A display panel 100, a PCB 201, the fingerprint sensor package 301, the conductive rear cover 401, a window 500, a rear sheet member 600, bonding layers 810, 820, 830, 840, and 850, and a processor are as described above with reference to FIGS. 1 through 12, and thus, to the extent that a detailed description of corresponding elements is omitted, it may be assumed that the corresponding elements are at least similar to those described above with respect to FIGS. 1 through 12.

Figure 15:
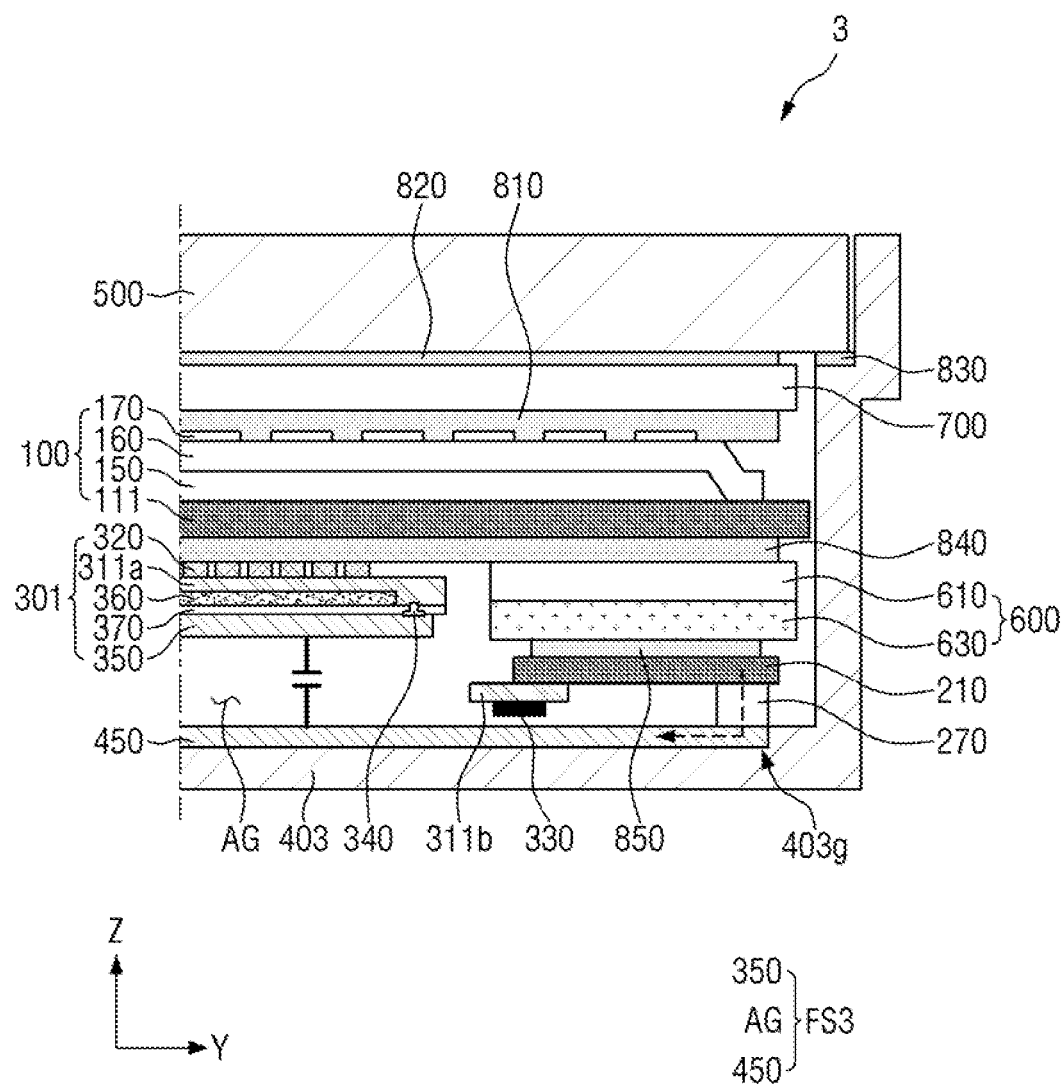
FIGS. 15 and 16 are cross-sectional views illustrating a display device according to an exemplary embodiment of the present disclosure.
Figure 16:
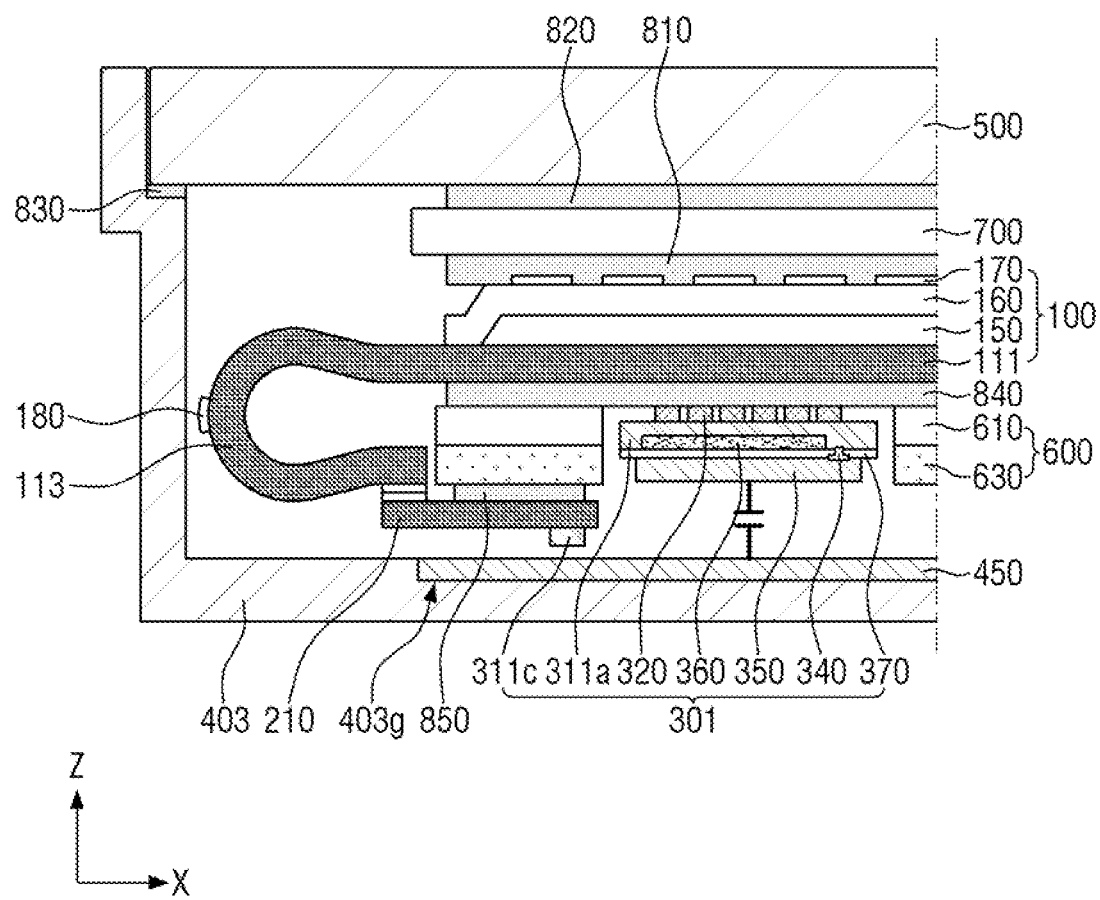

FIGS. 15 and 16 are cross-sectional views illustrating a display device 3 according to an exemplary embodiment of the present disclosure. For example, FIG. 15 is a cross-sectional view illustrating a part of the display device 3 at a location corresponding to FIG. 11, and FIG. 16 is a cross-sectional view illustrating a part of the display device 3 at a location corresponding to FIG. 12.

Referring to FIGS. 15 and 16, the display device 3 differs from the display device 1 in that a rear cover 403 includes a groove 403*g*. The rear cover 403 may be formed of a non-conductive material.

In one exemplary embodiment of the present disclosure, the rear cover 403 may be configured to receive a display panel 100, a PCB 201, and a fingerprint sensor package 301 and to include the groove 403*g*, which is formed at the bottom of the rear cover 403. The rear cover 403 may contain an insulating material and may thus be non-conductivity. For example, the rear cover 403 may contain a polymer material with excellent strength and excellent rigidity.

A second conductive layer 450 may be inserted in the groove 403g of the rear cover 403. The second conductive layer 450 may be disposed to overlap with, be spaced apart from, and face, a first conductive layer 350 of the fingerprint sensor package 301. The first conductive layer 350, the second conductive layer 450, and an air layer AG interposed therebetween may form a pressure sensor FS3. According to an exemplary embodiment of the present disclosure, an elastic body may be disposed to at least partially fill the gap between the first and second conductive layers 350 and 450.

The second conductive layer 450, which is inserted in the groove 403g of the rear cover 403, may be electrically connected to conductive patterns of the circuit board base 210. For example, the second conductive layer 450 may be electrically connected to the conductive patterns of the circuit board base 210 via a conductor 270. The second conductive layer 450 may receive a ground signal from a touch sensor IC. For example, the second conductive layer 450 may be a second conductive electrode or a ground electrode of the pressure sensor FS3.

The display panel 100, the PCB 201, the fingerprint sensor package 301, a window 500, a rear sheet member 600, bonding layers 810, 820, 830, 840, and 850, and a processor are as described above with reference to FIGS. 1 through 12, and thus, to the extent that a detailed description of corresponding elements is omitted, it may be assumed that the corresponding elements are at least similar to those described above with respect to FIGS. 1 through 12.

Figure 17:
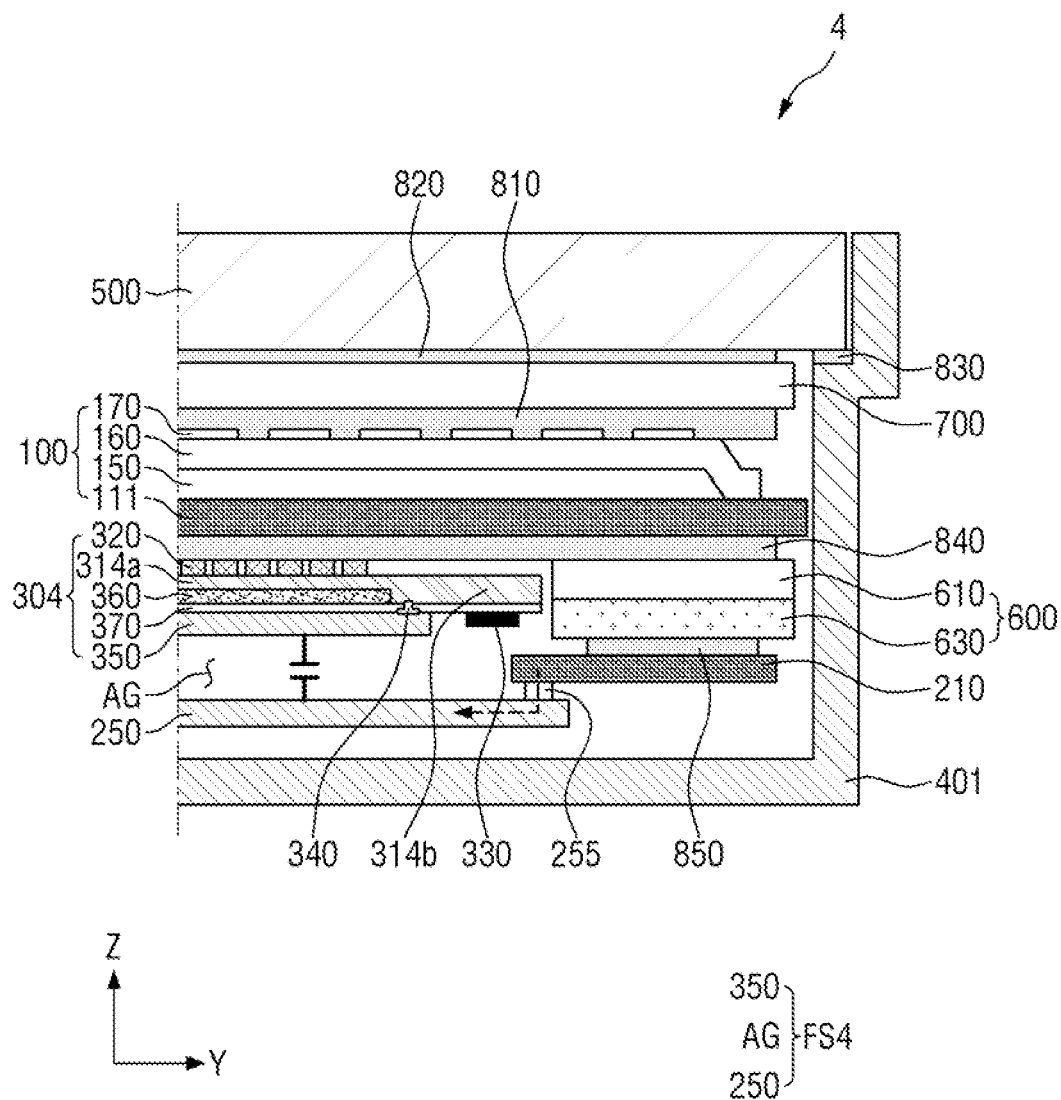
FIGS. 17 and 18 are cross-sectional views illustrating a display device according to an exemplary embodiment of the present disclosure.
Figure 18:
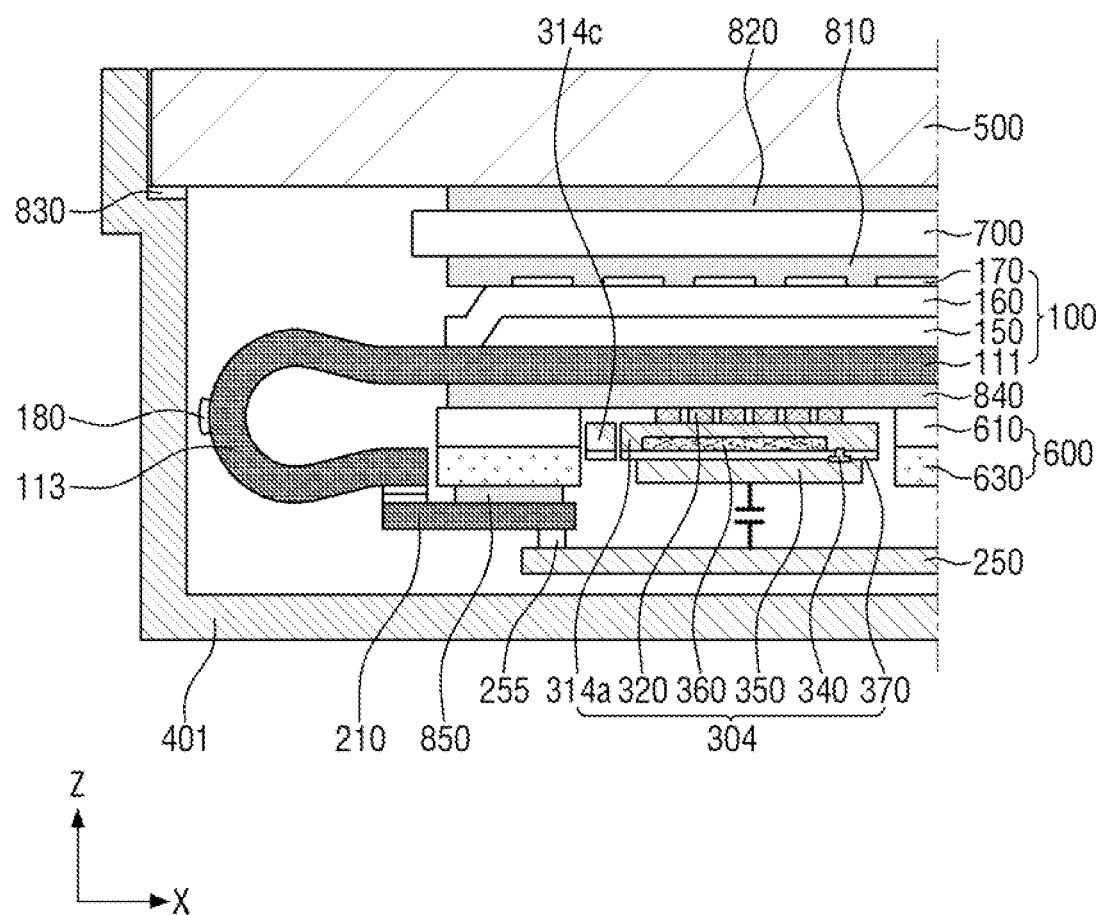
Figure 19:
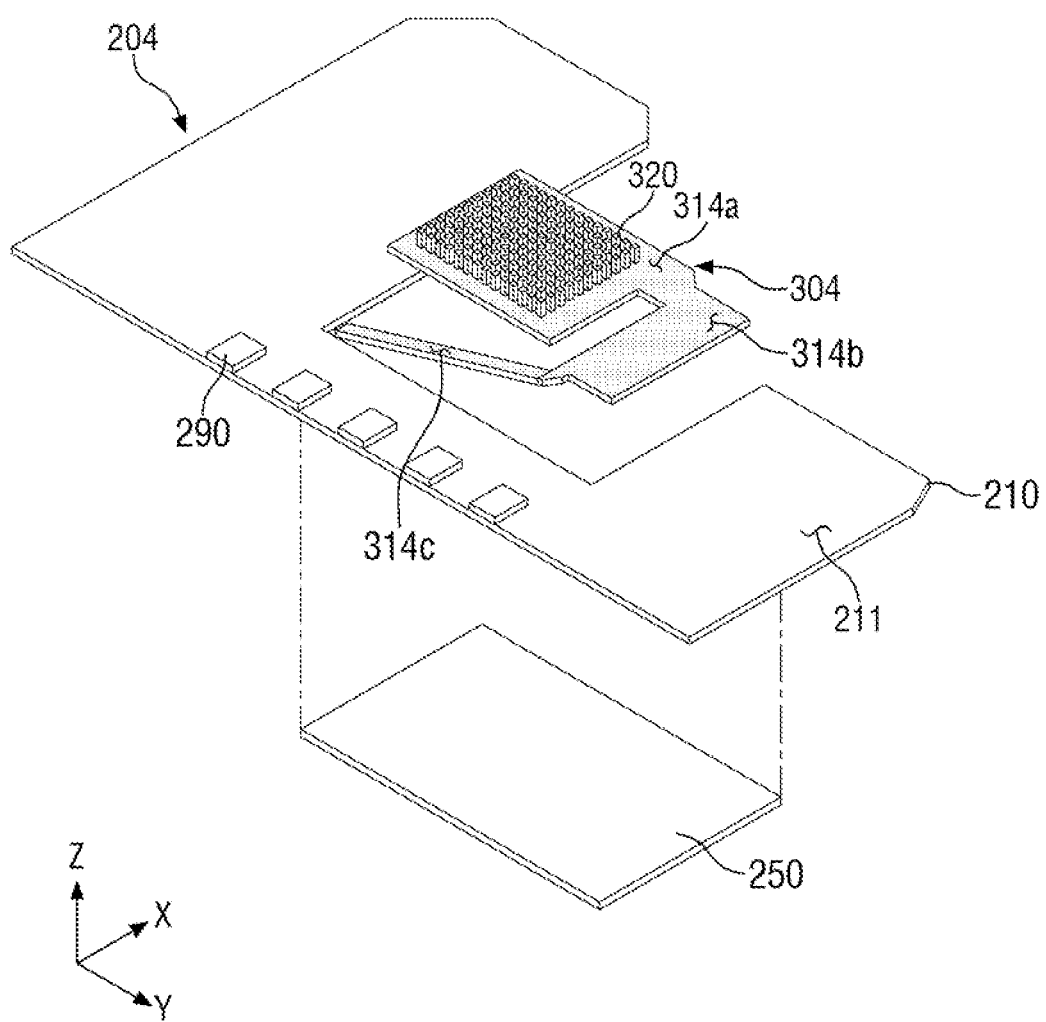
FIG. 19 is a perspective view illustrating a PCB and a fingerprint sensor package of the display device of FIG. 17.
Figure 20:
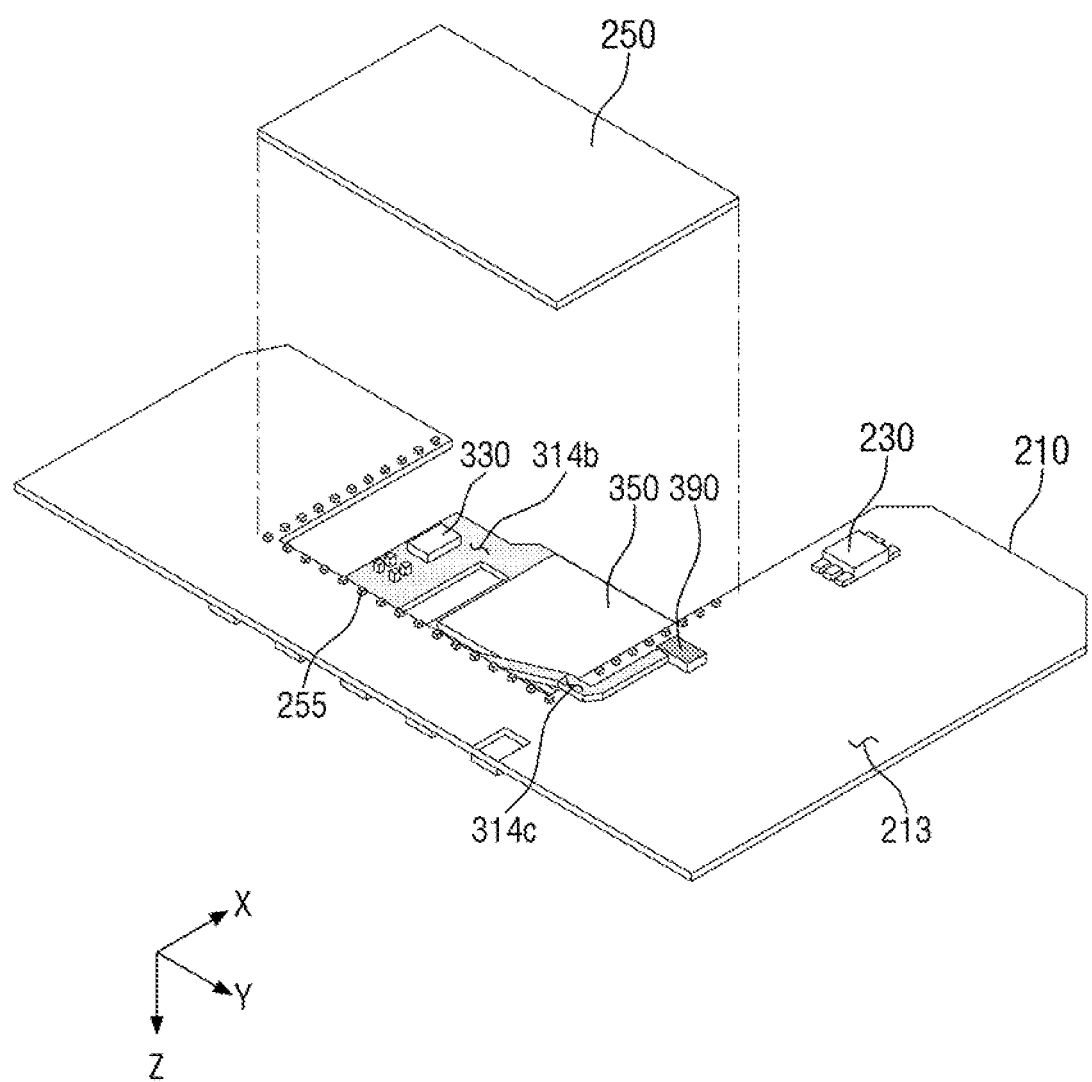
FIG. 20 is a rear perspective view illustrating the PCB and the fingerprint sensor package of FIG. 19.

FIGS. 17 and 18 are cross-sectional views of a display device 4 according to an exemplary embodiment of the present disclosure. For example, FIG. 17 is a cross-sectional view illustrating a part of the display device 4 at a location corresponding to FIG. 11, and FIG. 18 is a cross-sectional view illustrating a part of the display device 4 at a location corresponding to FIG. 12. FIG. 19 is a perspective view showing a PCB 204 and a fingerprint sensor package 304 of the display device 4 of FIG. 17. FIG. 20 is a rear perspective view showing the PCB 204 and the fingerprint sensor package 304 of FIG. 19.

Referring to FIGS. 17 through 20, the display device 4 differs from the display device 1 in that a PCB 204 further includes a second conductive layer 250 soldered on a rear surface 213 of a circuit board base 210.

The second conductive layer 250 may be disposed to overlap with, be spaced apart from, and face, a first conductive layer 350 of the fingerprint sensor package 304. The first conductive layer 350, the second conductive layer 250, and an air layer AG interposed therebetween may form a pressure sensor FS4. According to an exemplary embodiment of the present disclosure, an elastic body may be disposed to at least partially fill the gap between the first and second conductive layers 350 and 250.

The second conductive layer 250 may at least partially overlap with the circuit board base 210 in the third direction Z. The front surface of the second conductive layer 250 may be disposed at a lower level than the rear surface 213 of the circuit board base 210. The rear surface of the second conductive layer 250 may be spaced apart from a rear cover 401.

The second conductive layer 250 may be electrically connected to conductive patterns of the circuit board base 210. For example, the second conductive layer 250 may be electrically connected to the conductive patterns of the circuit board base 210 via solder portions 255. The second conductive layer 250 may receive a ground signal from a touch sensor IC. For example, the second conductive layer 250 may be a second conductive electrode or a ground electrode of the pressure sensor FS4.

The fingerprint sensor base 314 may include an image sensor supporting portion 314a providing a space in which an image sensor 320 is to be arranged, an image sensor IC supporting portion 314b protruding from the image sensor supporting portion 314a and providing a space in which an image sensor IC 330 is to be arranged, and a connector portion 314c protruding from the image sensor IC supporting portion 314b, having a connector 390, which is for being connected to the PCB 204, and electrically connecting the image sensor IC 330 and the connector 390.

In one exemplary embodiment of the present disclosure, the image sensor supporting portion 314a and the image sensor IC supporting portion 314b of the fingerprint sensor base 314 may be disposed at a higher level than the circuit board base 210 of the PCB 204. For example, the image sensor supporting portion 314a and the image sensor IC supporting portion 314b of the fingerprint sensor base 314 may be located in an opening of a rear sheet member 600. The image sensor supporting portion 314a and the image sensor IC supporting portion 314b of the fingerprint sensor base 314 might not overlap with the PCB 204 in the third direction Z.

The connector portion 314c of the fingerprint sensor base 314 may at least partially overlap the circuit board base 210 of the PCB 204 in the third direction Z and might not even partially overlap the circuit board base 210 of the PCB 204 in the third direction Z. For example, a portion of the fingerprint sensor base 314 between the image sensor supporting portion 314a and the image sensor IC supporting portion 314b may be bent or folded, and at least part of the front surface of the connector portion 314c may face the rear surface 213 of the circuit board base 210. The connector 390 of the connector portion 314c may be electrically connected to the conductive patterns on the rear surface 213 of the circuit board base 210. In some exemplary embodiments of the present disclosure, the connector portion 314c may be at least partially interposed between the second conductive layer 250 and the circuit board base 210.

A display panel 100, the rear cover 401, a window 500, the rear sheet member 600, bonding layers 810, 820, 830, 840, and 850, and a processor are as described above with reference to FIGS. 1 through 12, and thus, to the extent that a detailed description of corresponding elements is omitted, it may be assumed that the corresponding elements are at least similar to those described above with respect to FIGS. 1 through 12.

Exemplary embodiments of the present invention have been disclosed for illustrative purposes, those skilled in the art will appreciate that various modifications, additions and substitutions are possible, without departing from the scope and spirit of the invention.

While the present invention has been particularly illustrated and described with reference to exemplary embodiments thereof, it will be understood by those of ordinary skill in the art that various changes in form and detail may be made therein without departing from the spirit and scope of the present invention.

What is claimed is:

1. A display device comprising:
   a display panel;
   a fingerprint sensor package disposed on the display panel; and a circuit board base electrically connected to the fingerprint sensor package,
wherein the fingerprint sensor package includes:
a first base including a first portion and a second portion;
an image sensor disposed on a first surface of the first portion which faces the display panel;
an image sensor integrated circuit (IC) disposed on a first surface of the second portion;
a connector portion extending from the second portion,
a connector connected to the connector portion, and
a first conductive layer disposed on a second surface of the first portion and overlapping the image sensor,
wherein the connector is connected to conductive patterns on a first surface of the circuit board base,
wherein a vertical level of the first portion is identical to a vertical level of the second portion,
wherein a vertical level of the connector is different from the vertical level of the first portion and the vertical level of the second portion,
wherein a vertical level of the first conductive layer is between a vertical level of the first portion and the vertical level of the connector,
wherein a second conductive layer is spaced apart from the first conductive layer by an air layer,
wherein the connector portion is at least partially interposed between the second conductive layer and the circuit board base, and
wherein the second conductive layer is connected to soldering patterns on the first surface of the circuit board base.

2. The display device of claim 1, wherein the first portion is closer to the display panel than the connector.

3. The display device of claim 1, wherein the first portion is positioned at a different level than that of the second portion and the connector portion.

4. The display device of claim 1,
wherein the second surface of the first portion is opposite to the first surface of the first portion, and
wherein the connector portion does not overlap the first conductive layer.

5. The display device of claim 4, the first conductive layer is electrically connected to a plurality of conductive patterns of the first portion via a via electrode.

6. The display device of claim 4, wherein a second surface of the second portion faces the display panel, and the first surface of the second portion is opposite to the second surface of the second portion.

7. The display device of claim 6, further comprising a touch sensor integrated circuit electrically connected to the first conductive layer to measure pressure.

8. The display device of claim 6, further comprising: an elastic body disposed on the first conductive layer, and
wherein the elastic body is spaced apart from the rear cover by an air layer.

9. The display device of claim 8, wherein the first portion and the second portion is closer to the display panel than the circuit board base.

10. The display device of claim 4, further comprising a rear cover spaced apart from the first conductive layer by an air layer, and
wherein the first conductive layer and the rear cover form a capacitor.

11. The display device of claim 1, wherein the second portion is not positioned at a same level with that of the connector.

12. The display device of claim 1, wherein the circuit board base does not overlap the first portion, and
wherein the circuit board base overlaps the second portion, the connector portion, and the connector.

13. The display device of claim 1, wherein each of the first portion and the second portion is positioned at a different level than that of the circuit board base.

14. The display device of claim 1, wherein the first portion is closer to the display panel than the circuit board base.

15. The display device of claim 1, wherein the circuit board base is closer to the display panel than the second portion, the connector portion, and the connector.

16. The display device of claim 1, wherein the circuit board base is closer to the display panel than the connector.

17. The display device of claim 1, wherein the first conductive layer and the second conductive layer form a capacitor.

18. The display device of claim 17, wherein the first conductive layer is closer to the display panel than the second conductive layer.

19. The display device of claim 17, wherein the second conductive layer is disposed on the first surface of the circuit board base, and
wherein a second surface of the circuit board base faces the display panel, and the second surface of the circuit board base is opposite to the first surface of the printed circuit board.

20. The display device of claim 17, wherein an area of the second conductive layer is larger than an area of the first conductive layer.

21. The display device of claim 17, wherein the second conductive layer at least partially overlaps the first conductive layer.

22. The display device of claim 1, further comprising a rear sheet member disposed on the display panel and having an opening, and
wherein the first portion is disposed in the opening.

23. The display device of claim 22, wherein the second portion and the connection portion are not disposed in the opening.

24. The display device of claim 22, wherein the second portion and the connection portion are disposed on the rear sheet member.

25. The display device of claim 1, wherein the connector is directly connected to the circuit board base.

26. A display device comprising:
a display panel; and
a fingerprint sensor package disposed on the display panel, and
wherein the fingerprint sensor package includes:
a first base including a first portion and a second portion;
an image sensor disposed on a first surface of the first portion which faces the display panel;
an image sensor integrated circuit (IC) disposed on a first surface of the second portion;
a connector portion extending from the second portion, and
a connector connected to the connector portion, and
wherein the first portion is positioned at a different level than that of the connector,
wherein the fingerprint sensor package further includes a first conductive layer disposed on a second surface of the first portion and overlapping the image sensor, and
wherein the second surface of the first portion is opposite to the first surface of the first portion, wherein the connector portion does not overlap the first conductive layer, wherein the first conductive layer is electrically connected to a plurality of conductive patterns of the first portion via a via electrode, wherein a shielding electrode layer is disposed between the first portion and the first conductive layer, wherein an insulating layer is disposed between the shielding electrode layer and the first conductive layer to insulate both the shielding electrode layer and the first conductive layer, and wherein the via electrode penetrates the insulating layer.

\* \* \* \* \*